United States Patent
Yoshizumi et al.

(10) Patent No.: US 8,507,305 B2
(45) Date of Patent: Aug. 13, 2013

(54) GROUP-III NITRIDE SEMICONDUCTOR LASER DEVICE, METHOD OF FABRICATING GROUP-III NITRIDE SEMICONDUCTOR LASER DEVICE, AND EPITAXIAL SUBSTRATE

(75) Inventors: Yusuke Yoshizumi, Itami (JP); Yohei Enya, Itami (JP); Takashi Kyono, Itami (JP); Takamichi Sumitomo, Itami (JP); Nobuhiro Saga, Osaka (JP); Masahiro Adachi, Osaka (JP); Kazuhide Sumiyoshi, Osaka (JP); Shinji Tokuyama, Osaka (JP); Shimpei Takagi, Osaka (JP); Takatoshi Ikegami, Itami (JP); Masaki Ueno, Itami (JP); Koji Katayama, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/443,480

(22) Filed: Apr. 10, 2012

(65) Prior Publication Data
US 2012/0258557 A1 Oct. 11, 2012

Related U.S. Application Data

(62) Division of application No. 12/837,847, filed on Jul. 16, 2010.

(30) Foreign Application Priority Data

Dec. 25, 2009 (JP) ................................. P2009-295802
Jul. 13, 2010 (JP) ................................. P2010-158949

(51) Int. Cl.
*H01L 21/00* (2006.01)

(52) U.S. Cl.
USPC ...................................... 438/47; 257/E33.023

(58) Field of Classification Search
USPC ......... 438/33, 35, 41, 42, 47, 77; 257/E33.023
See application file for complete search history.

(56) References Cited

U.S. PATENT DOCUMENTS 8,071,405 B2 * 12/2011 Takagi et al. .................... 438/33
8,076,167 B2 * 12/2011 Takagi et al. .................... 438/33

(Continued)

FOREIGN PATENT DOCUMENTS

JP 2001-230497 8/2001
JP 2005-353690 A 12/2005

(Continued)

OTHER PUBLICATIONS

Tayagi et al. "Semipolar (10-1-1) InGaN/GaN Laser Diodes on Bulk GaN Substrates," Japanese Journal of Applied Physics, vol. 46, No. 19, pp. L444-L445 (2007).

*Primary Examiner* — Brook Kebede
(74) *Attorney, Agent, or Firm* — Venable LLP; Michael A. Sartori; Tamatane J. Aga

(57) ABSTRACT

A III-nitride semiconductor laser device is provided with a laser structure and an electrode. The laser structure includes a support base which includes a hexagonal III-nitride semiconductor and a semipolar primary surface, and a semiconductor region provided on the semipolar primary surface. The electrode is provided on the semiconductor region. The semiconductor region includes a first cladding layer of a first conductivity type GaN-based semiconductor, a second cladding layer of a second conductivity type GaN-based semiconductor, and an active layer provided between the first cladding layer and the second cladding layer.

16 Claims, 29 Drawing Sheets

(56) References Cited

U.S. PATENT DOCUMENTS

| | | |
|---|---|---|
| 8,105,857 B2 * | 1/2012 | Takagi et al. ............... 438/33 |
| 8,227,277 B2 * | 7/2012 | Yoshizumi et al. .......... 438/33 |
| 2003/0039286 A1 | 2/2003 | Doi et al. |
| 2005/0230690 A1 * | 10/2005 | Hata ............................ 257/79 |
| 2005/0269584 A1 | 12/2005 | Hasegawa et al. |
| 2008/0199983 A1 | 8/2008 | Nakamura et al. |
| 2008/0230766 A1 | 9/2008 | Okamoto et al. |
| 2009/0059983 A1 | 3/2009 | Hasegawa et al. |
| 2009/0268768 A1 | 10/2009 | Ueno et al. |
| 2009/0310640 A1 | 12/2009 | Sato et al. |
| 2010/0080001 A1 | 4/2010 | Kunoh et al. |

FOREIGN PATENT DOCUMENTS

| | | |
|---|---|---|
| JP | 2007-184353 A | 7/2007 |
| JP | 2008-016772 | 1/2008 |
| JP | 2008-060375 A | 3/2008 |
| JP | 2008-187044 A | 8/2008 |
| JP | 2008-235804 A | 10/2008 |
| JP | 2009-081336 | 4/2009 |
| JP | 2009-267124 | 11/2009 |
| JP | 4475357 | 3/2010 |
| JP | 2010-109331 | 5/2010 |
| JP | 2008-227461 | 6/2010 |

* cited by examiner (a)

(b)

$$\rho = \frac{I1 - I2}{I1 + I2}$$

| | HEXAGONAL GaN | | | | | | | | | |
|---|---|---|---|---|---|---|---|---|---|---|
| | a | c | h1 | k1 | l1 | h2 k2 l2 | cos θ | Arccos(rad) | (deg) | |
| PLANE INDICES OF PLANES PERPENDICULAR TO (20-21) | 3.189 | 5.185 | -1 | 0 | 1 | 2 0 1 | -0.7 | 2.4 | 137.05 | |
| | 3.189 | 5.185 | -1 | 0 | 2 | 2 0 1 | -0.5 | 2.1 | 118.28 | |
| | 3.189 | 5.185 | -1 | 0 | 3 | 2 0 1 | -0.3 | 1.9 | 107.13 | |
| | 3.189 | 5.185 | -1 | 0 | 4 | 2 0 1 | -0.2 | 1.7 | 100.23 | |
| | 3.189 | 5.185 | -1 | 0 | 5 | 2 0 1 | -0.1 | 1.7 | 95.67 | |
| | 3.189 | 5.185 | -1 | 0 | 6 | 2 0 1 | 0.0 | 1.6 | 92.46 | → (-1016) PLANE |
| | 3.189 | 5.185 | -1 | 0 | 7 | 2 0 1 | 0.0 | 1.6 | 90.10 | → (-1017) PLANE |
| | 3.189 | 5.185 | -1 | 0 | 8 | 2 0 1 | 0.0 | 1.5 | 88.29 | → (-1018) PLANE |
| | 3.189 | 5.185 | -1 | 0 | 9 | 2 0 1 | 0.1 | 1.5 | 86.87 | |
| | 3.189 | 5.185 | -1 | 0 | 10 | 2 0 1 | 0.1 | 1.5 | 85.72 | |
| | 3.189 | 5.185 | -2 | 0 | 1 | 2 0 1 | -0.9 | 2.6 | 150.17 | |
| | 3.189 | 5.185 | -2 | 0 | 2 | 2 0 1 | -0.7 | 2.4 | 137.05 | |
| | 3.189 | 5.185 | -2 | 0 | 3 | 2 0 1 | -0.6 | 2.2 | 126.46 | |
| | 3.189 | 5.185 | -2 | 0 | 4 | 2 0 1 | -0.5 | 2.1 | 118.28 | |
| | 3.189 | 5.185 | -2 | 0 | 5 | 2 0 1 | -0.4 | 2.0 | 111.99 | |
| | 3.189 | 5.185 | -2 | 0 | 6 | 2 0 1 | -0.3 | 1.9 | 107.13 | |
| | 3.189 | 5.185 | -2 | 0 | 7 | 2 0 1 | -0.2 | 1.8 | 103.30 | |
| | 3.189 | 5.185 | -2 | 0 | 8 | 2 0 1 | -0.2 | 1.7 | 100.23 | |
| | 3.189 | 5.185 | -2 | 0 | 9 | 2 0 1 | -0.1 | 1.7 | 97.73 | |
| | 3.189 | 5.185 | -2 | 0 | 10 | 2 0 1 | -0.1 | 1.7 | 95.67 | |
| | 3.189 | 5.185 | -3 | 0 | 1 | 2 0 1 | -0.9 | 2.7 | 155.02 | |
| | 3.189 | 5.185 | -3 | 0 | 2 | 2 0 1 | -0.8 | 2.5 | 145.54 | |
| | 3.189 | 5.185 | -3 | 0 | 3 | 2 0 1 | -0.7 | 2.4 | 137.05 | |
| | 3.189 | 5.185 | -3 | 0 | 4 | 2 0 1 | -0.6 | 2.3 | 129.71 | |
| | 3.189 | 5.185 | -3 | 0 | 5 | 2 0 1 | -0.6 | 2.2 | 123.49 | |
| | 3.189 | 5.185 | -3 | 0 | 6 | 2 0 1 | -0.5 | 2.1 | 118.28 | |
| | 3.189 | 5.185 | -3 | 0 | 7 | 2 0 1 | -0.4 | 2.0 | 113.91 | |
| | 3.189 | 5.185 | -3 | 0 | 8 | 2 0 1 | -0.3 | 1.9 | 110.23 | |
| | 3.189 | 5.185 | -3 | 0 | 9 | 2 0 1 | -0.3 | 1.9 | 107.13 | |
| | 3.189 | 5.185 | -3 | 0 | 10 | 2 0 1 | -0.2 | 1.8 | 104.48 | |

(a)

(b)

(a)

(b)

(c)

(a)

(b)

(c)

GROUP-III NITRIDE SEMICONDUCTOR LASER DEVICE, METHOD OF FABRICATING GROUP-III NITRIDE SEMICONDUCTOR LASER DEVICE, AND EPITAXIAL SUBSTRATE

CROSS-REFERENCE TO RELATED APPLICATIONS

This application is a Divisional of U.S. patent application Ser. No. 12/837,847, filed Jul. 16, 2010, which claims the benefit of Japanese Patent Application Nos. 2009-295802, filed Dec. 25, 2009, and 2010-158949, filed Jul. 13, 2010, all of which are incorporated herein by reference in their entirety.

BACKGROUND OF THE INVENTION

1. Field of the Invention

The present invention relates to a III-nitride semiconductor laser device, and a method of fabricating the III-nitride semiconductor laser device.

2. Related Background Art

Patent Literature 1 discloses a laser device. When a primary surface of a substrate is a face inclined at 28.1 degrees from a {0001} plane toward a direction equivalent to the [1-100] direction, secondary cleaved facets are {11-20} planes perpendicular to both of the primary surface and optical cavity faces, and the laser device is of a rectangular parallelepiped shape.

Patent Literature 2 discloses a nitride semiconductor device. The back surface of the substrate for cleavage is polished to reduce the total thickness to about 100 µm. A dielectric multilayer film is deposited on cleaved facets.

Patent Literature 3 discloses a nitride-based compound semiconductor device. The substrate used for the nitride-based compound semiconductor device is comprised of a nitride-based compound semiconductor with the threading dislocation density of not more than $3 \times 10^6$ cm$^{-2}$ and the in-plane threading dislocation density is substantially uniform.

Patent Literature 4 discloses a nitride-based semiconductor laser device. In the nitride-based semiconductor laser device, cleaved facets are formed as described below. With respect to recesses which are made by etching from layers for the semiconductor laser device to an n-type GaN substrate, scribed grooves are formed using a laser scriber and arranged like a dashed line (at intervals of about 40 µm) in a direction orthogonal to an extending direction of ridge portions, while avoiding projections made during the etching of cavity faces on the n-type GaN substrate. Then the wafer is cleaved at positions of the scribed grooves. On this occasion, each of regions without the scribed grooves, e.g., each projection, is cleaved from the adjacent scribed groove as an origin. As a result, device separation faces are formed as a cleaved facet of a (0001) plane of the n-type GaN substrate.

Patent Literature 5 discloses a light emitting device. The light emitting device is able to readily emit light at a long wavelength, without deterioration of luminous efficiency in its light emitting layer.

Non-patent Literature 1 discloses a semiconductor laser in which a waveguide is provided in an off-axis direction and in which minors are made by reactive ion etching, on a semipolar (10-1-1) plane.

Patent Literature 1: Japanese Patent Application Laid-open No. 2001-230497

Patent Literature 2: Japanese Patent Application Laid-open No. 2005-353690

Patent Literature 3: Japanese Patent Application Laid-open No. 2007-184353

Patent Literature 4: Japanese Patent Application Laid-open No. 2009-081336

Patent Literature 5: Japanese Patent Application Laid-open No. 2008-235804

Non-patent Literature 1: Jpn. J. Appl. Phys. Vol. 46 (2007) L444

SUMMARY OF THE INVENTION

The band structure of a gallium nitride (GaN)-based semiconductor has some possible transitions capable of lasing. According to Inventors' knowledge, it is considered that in the III-nitride semiconductor laser device using the semipolar-plane support base the c-axis of which is inclined toward the m-axis, the threshold current can be lowered when the laser waveguide extends along a plane defined by the c-axis and the m-axis. When the laser waveguide extends in this orientation, a mode with the smallest transition energy (difference between conduction band energy and valence band energy) among the possible transitions becomes capable of lasing; when this mode becomes capable of lasing, the threshold current can be reduced.

However, this orientation of the laser waveguide does not allow use of the conventional cleaved facets such as c-planes, a-planes, or m-planes for the cavity mirrors. For this reason, the cavity minors have been made heretofore by forming dry-etched facets of semiconductor layers by reactive ion etching (RIE). There are now desires for improvement in the cavity mirrors formed by RIE, in terms of perpendicularity to the laser waveguide, flatness of the dry-etched facets, or ion damage. It becomes a heavy burden to derive process conditions for obtaining good dry-etched facets in the current technical level.

In fabrication of the III-nitride semiconductor laser device using the c-planes, when the minors for optical cavity were made using the conventional cleaved facets, the cleaved facets were formed by forming scribed grooves in the epi-side surface of thin films and pressing a blade against the back surface of the substrate. As far as the inventors know, in the III-nitride semiconductor laser device formed on the semipolar plane, no one has succeeded heretofore in achieving both of the laser waveguide extending in the inclination direction (off-axis direction) of the c-axis and the end faces for cavity minors formed without use of dry etching.

However, when the laser waveguide extends in the inclination direction (off-axis direction) of the c-axis, it is not feasible to produce the cavity minors using the conventional cleaved facets. According to Inventors' knowledge, end faces different form the cleaved facets can be used as the cavity minors in the III-nitride semiconductor laser device using a semipolar substrate the c-axis of which is inclined toward the m-axis. It is, however, found by Inventors' experiment that in the semiconductor laser using the end faces different from the cleaved facets for the cavity mirrors, a difference between the direction of the waveguide for the semiconductor laser and the direction of inclination of the c-axis significantly affects the lasing characteristic of the semiconductor laser. The applicant of the present application filed a Japanese patent application (Japanese Patent Application No. 2009-144442) associated with the III-nitride semiconductor laser device including fractured faces for the optical cavity.

It is an object of the present invention to provide a III-nitride semiconductor laser device with a laser cavity, enabling a low threshold current and a structure enabling improvement in lasing yield, on a semipolar plane of a support base inclined from the c-axis toward the m-axis of a hexagonal III-nitride, and to provide a method for fabricating the III-nitride semiconductor laser device. It is a further object of the present invention to provide an epitaxial substrate for the III-nitride semiconductor laser device.

A III-nitride semiconductor laser device according to one aspect of the present invention comprises: (a) a laser structure including a support base which comprises a hexagonal III-nitride semiconductor and has a semipolar primary surface, and a semiconductor region provided on the semipolar primary surface of the support base; and (b) an electrode provided on the semiconductor region of the laser structure. The semiconductor region comprises a first cladding layer of a first conductivity type GaN-based semiconductor, a second cladding layer of a second conductivity type GaN-based semiconductor, and an active layer provided between the first cladding layer and the second cladding layer; the first cladding layer, the second cladding layer, and the active layer are arranged along a normal axis to the semipolar primary surface; the active layer comprises a GaN-based semiconductor layer; the c-axis of the hexagonal III-nitride semiconductor of the support base is inclined at a finite angle ALPHA with respect to the normal axis toward the m-axis of the hexagonal III-nitride semiconductor; the laser structure comprises first and second fractured faces intersecting with an m-n plane defined by the m-axis of the hexagonal III-nitride semiconductor and the normal axis; a laser cavity of the III-nitride semiconductor laser device comprises the first and second fractured faces; the laser structure comprises first and second surfaces, and the first surface is opposite to the second surface; each of the first and second fractured faces extends from an edge of the first surface to an edge of the second surface.

In a first configuration of the foregoing III-nitride semiconductor laser device, the angle between the normal axis and the c-axis of the hexagonal III-nitride semiconductor is in the range of not less than 45 degrees and not more than 80 degrees or in the range of not less than 100 degrees and not more than 135 degrees; the laser structure comprises a laser waveguide extending on the semipolar primary surface of the support base; the laser waveguide extends in a direction of a waveguide vector directed from one to the other of the first and second fractured faces; a c-axis vector indicating a direction of the c-axis of the hexagonal III-nitride semiconductor includes a projected component parallel to the semipolar primary surface and a vertical component parallel to the normal axis; an angle difference between the waveguide vector and the projected component is in the range of not less than −0.5 degrees and not more than +0.5 degrees.

In a second configuration of the foregoing III-nitride semiconductor laser device, the angle between the normal axis and the c-axis of the hexagonal III-nitride semiconductor is in the range of not less than 45 degrees and not more than 80 degrees or in the range of not less than 100 degrees and not more than 135 degrees; the laser structure comprises a laser waveguide extending on the semipolar primary surface of the support base; the laser waveguide extends in a direction of a waveguide vector directed from one to the other of the first and second fractured faces; the laser structure exhibits a streaky emission image extending in a direction of a predetermined axis in a fluorescence microscope image based on photo-excitation with a mercury lamp; an angle difference between the waveguide vector and a direction orthogonal to the predetermined axis is in the range of not less than −0.5 degrees and not more than +0.5 degrees.

In the above-defined III-nitride semiconductor laser device, because the first and second fractured faces that form the laser cavity intersect with the m-n plane defined by the normal axis and the m-axis of the hexagonal III-nitride semiconductor, it is feasible to provide the laser waveguide extending in a direction of a line of intersection between the m-n plane and the semipolar surface. Therefore, the present invention succeeds in providing the III-nitride semiconductor laser device with the laser cavity enabling a low threshold current.

In this III-nitride semiconductor laser device, when the angle is in the range of less than 45 degrees or in the range of more than 135 degrees, end faces made by press are highly likely to be comprised of m-planes. When the angle is in the range of more than 80 degrees and less than 100 degrees, it may result in failing to achieve desired flatness and perpendicularity.

In this III-nitride semiconductor laser device, when the angle difference is in the range of not less than −0.5 degrees and not more than +0.5 degrees, the lasing yield is improved. When the angle difference is in the range of not less than −0.3 degrees and not more than +0.3 degrees, threshold variation is improved.

In the III-nitride semiconductor laser device according to the above aspect of the present invention, more preferably, the angle between the normal axis and the c-axis of the hexagonal III-nitride semiconductor falls within the range of not less than 63 degrees and not more than 80 degrees or within the range of not less than 100 degrees and not more than 117 degrees.

In this III-nitride semiconductor laser device, when the angle is in the range of not less than 63 degrees and not more than 80 degrees or in the range of not less than 100 degrees and not more than 117 degrees, end faces made by press are highly likely to be faces nearly perpendicular to the primary surface of the substrate. When the angle is in the range of more than 80 degrees and less than 100 degrees, it may result in failing to achieve desired flatness and perpendicularity.

In the III-nitride semiconductor laser device according to the above aspect of the present invention, a thickness of the support base is preferably not more than 400 μm. This III-nitride semiconductor laser device is suitable for obtaining excellent-quality fractured faces for the laser cavity.

In the III-nitride semiconductor laser device according to the above aspect of the present invention, more preferably, the thickness of the support base is not less than 50 μm and not more than 100 μm. When the thickness is not less than 50 μm, handling becomes easier and production yield becomes higher. When the thickness is not more than 100 μm, it is more suitable for obtaining excellent-quality fractured faces for the laser cavity.

In the III-nitride semiconductor laser device according to the above aspect of the present invention, laser light from the active layer is polarized in a direction of the a-axis of the hexagonal III-nitride semiconductor. In this III-nitride semiconductor laser device, a band transition allowing for achievement of a low threshold current has polarized nature.

In the III-nitride semiconductor laser device according to the above aspect of the present invention, light in the LED mode in the III-nitride semiconductor laser device includes a polarization component I1 in the direction of the a-axis of the hexagonal III-nitride semiconductor, and a polarization component I2 in a projected direction of the c-axis of the hexagonal III-nitride semiconductor on the primary surface, and the polarization component I1 is greater than the polarization component I2. This III-nitride semiconductor laser device can be provided with lasing operation using the laser cavity to emit light in a mode with large emission intensity in the LED mode.

In the III-nitride semiconductor laser device according to the above aspect of the present invention, preferably, the semipolar primary surface is one of a {20-21} plane, a {10-11} plane, a {20-2-1} plane, and a {10-1-1} plane.

This III-nitride semiconductor laser device allows for provision of first and second end faces with flatness and perpendicularity enough to construct the laser cavity of the III-nitride semiconductor laser device, on these typical semipolar planes.

In the III-nitride semiconductor laser device according to the above aspect of the present invention, the semipolar primary surface suitably applicable is a surface with a slight slant in the range of not less than −4 degrees and not more than +4 degrees from any one semipolar plane of a {20-21} plane, a {10-11} plane, a {20-2-1} plane, and a {10-1-1} plane, toward an m-plane.

This III-nitride semiconductor laser device allows for provision of the first and second end faces with flatness and perpendicularity enough to construct the laser cavity of the III-nitride semiconductor laser device, on the slight slant surface with respect to these typical semipolar planes.

In the III-nitride semiconductor laser device according to the above aspect of the present invention, preferably, a stacking fault density of the support base is not more than $1\times10^4$ $cm^{-1}$.

In this III-nitride semiconductor laser device, because the stacking fault density is not more than $1\times10^4$ $cm^{-1}$, the flatness and/or perpendicularity of the fractured faces is unlikely to be disturbed for a certain accidental reason.

In the III-nitride semiconductor laser device according to the above aspect of the present invention, the support base can comprise any one of GaN, AlGaN, AlN, InGaN, and InAlGaN.

In this III-nitride semiconductor laser device, when the substrate used is comprised of one of these GaN-based semiconductors, it becomes feasible to obtain the first and second end faces applicable to the cavity. Use of an AlN substrate or AlGaN substrate allows for increase in degree of polarization and enhancement of optical confinement by virtue of low refractive index. Use of an InGaN substrate allows for decrease in lattice mismatch between the substrate and the light emitting layer and improvement in crystal quality.

The III-nitride semiconductor laser device according to the above aspect of the present invention further comprises a dielectric multilayer film provided on at least one of the first and second fractured faces.

In this III-nitride semiconductor laser device, an end face coat is also applicable to the fractured faces. The end face coat allows for adjustment of reflectance.

In the III-nitride semiconductor laser device according to the above aspect of the present invention, the active layer can include a quantum well structure provided so as to generate light at a wavelength of not less than 360 nm and not more than 600 nm. Since this III-nitride semiconductor laser device makes use of the semipolar plane, the resultant device is the III-nitride semiconductor laser device making efficient use of polarization in the LED mode and achieves a low threshold current.

In the III-nitride semiconductor laser device according to the above aspect of the present invention, more preferably, the active layer includes a quantum well structure provided so as to generate light at a wavelength of not less than 430 nm and not more than 550 nm. Since this III-nitride semiconductor laser device makes use of the semipolar surface, it allows for increase in quantum efficiency through decrease of the piezoelectric field and improvement in crystal quality of the light emitting layer region and it is thus suitably applicable to generation of light at the wavelength of not less than 430 nm and not more than 550 nm.

In the III-nitride semiconductor laser device according to the above aspect of the present invention, an end face of the support base and an end face of the semiconductor region are exposed in each of the first and second fractured faces, and an angle between the end face of the semiconductor region in the active layer and a reference plane perpendicular to the m-axis of the support base of the hexagonal nitride semiconductor is in the range of not less than (ALPHA−5) degrees and not more than (ALPHA+5) degrees on a first plane defined by the c-axis and the m-axis of the III-nitride semiconductor.

This III-nitride semiconductor laser device has the end faces satisfying the foregoing perpendicularity, concerning the angle taken from one to the other of the c-axis and the m-axis.

In the III-nitride semiconductor laser device according to the above aspect of the present invention, preferably, the angle is in the range of not less than −5 degrees and not more than +5 degrees on a second plane perpendicular to the first plane and the normal axis.

This III-nitride semiconductor laser device has the end faces that satisfy the foregoing perpendicularity, concerning the angle defined on the plane perpendicular to the normal axis to the semipolar surface.

In the III-nitride semiconductor laser device according to the above aspect of the present invention, the electrode extends in a direction of a predetermined axis, and the first and second fractured faces intersect with the predetermined axis.

Another aspect of the present invention relates to a method for fabricating a III-nitride semiconductor laser device. This method comprises the steps of: (a) preparing a substrate which comprises a hexagonal III-nitride semiconductor and has a semipolar primary surface; (b) forming a substrate product which comprises an anode electrode, a cathode electrode and a laser structure including the substrate and a semiconductor region formed on the semipolar primary surface; (c) scribing a first surface of the substrate product in part in a direction of the a-axis of the hexagonal III-nitride semiconductor; and (d) carrying out breakup of the substrate product by press against a second surface of the substrate product, to form another substrate product and a laser bar. The first surface is opposite to the second surface; the semiconductor region is located between the first surface and the substrate; the laser bar has first and second end faces which extends from the first surface to the second surface and are made by the breakup; the first and second end faces form a laser cavity of the III-nitride semiconductor laser device; the anode electrode and the cathode electrode are formed on the laser structure; the semiconductor region comprises a first cladding layer of a first conductivity type GaN-based semiconductor, a second cladding layer of a second conductivity type GaN-based semiconductor, and an active layer provided between the first cladding layer and the second cladding layer; the first cladding layer, the second cladding layer, and the active layer are arranged along a normal axis to the semipolar primary surface; the active layer comprises a GaN-based semiconductor layer; the c-axis of the hexagonal III-nitride semiconductor of the substrate is inclined at a finite angle ALPHA with respect to the normal axis toward the m-axis of the hexagonal III-nitride semiconductor; the first and second end faces intersect with an m-n plane that is defined by the m-axis of the hexagonal III-nitride semiconductor and the normal axis; the angle between the normal axis and the c-axis of the hexagonal III-nitride semiconductor is in the range of not less than 45 degrees and not more than 80 degrees or in the range of not less than 100 degrees and not more than 135 degrees; the laser structure comprises a laser waveguide which extends on the semipolar primary surface of the substrate; the laser waveguide extends in a direction of a waveguide vector directed from one to the other of the first and second fractured faces; a c-axis vector which indicates a direction of the c-axis of the hexagonal III-nitride semiconductor includes a projected component parallel to the semipolar primary surface and a vertical component parallel to the normal axis; an angle difference between the waveguide vector, and the projected component is in the range of not less than −0.5 degrees and not more than +0.5 degrees; the semiconductor region of the substrate product comprises a mark indicative of a direction of the a-axis of the hexagonal III-nitride semiconductor; the substrate product comprises the laser waveguide that extends on the semipolar primary surface of the substrate; the laser waveguide extends in the direction of the waveguide vector directed from one to the other of the first and second fractured faces; in the step of forming the substrate product, direction of the laser waveguide is determined based on the mark.

According to this method, the first surface of the substrate product is scribed in the direction of the a-axis of the hexagonal III-nitride semiconductor, and thereafter the breakup of the substrate product is carried out by press against the second surface of the substrate product, thereby forming the other substrate product and the laser bar. For this reason, the first and second end faces are formed in the laser bar so as to intersect with the m-n plane that is defined by the m-axis of the hexagonal III-nitride semiconductor and the normal axis. This end face forming method provides the first and second end faces, working as mirror faces for optical cavity, with flatness and perpendicularity enough to construct the laser cavity of the III-nitride semiconductor laser device, or without ion damage. In this method, the laser waveguide extends in the direction of inclination of the c-axis of the hexagonal III-nitride, and the mirror end faces of the cavity capable of providing this laser waveguide are formed without use of dry-etched facets.

In this method, when the angle is in the range of less than 45 degrees or in the range of more than 135 degrees, the end faces made by press are highly likely to be comprised of m-planes. When the angle is in the range of more than 80 degrees and less than 100 degrees, it may result in failing to achieve the desired flatness and perpendicularity.

In this method, when the angle difference is in the range of not less than −0.5 degrees and not more than +0.5 degrees, the lasing yield is improved. When the angle difference is in the range of not less than −0.3 degrees and not more than +0.3 degrees, threshold variation is improved.

In the method according to the other aspect of the present invention, in the step of forming the substrate product, processing such as slicing or grinding of the substrate is performed so that a thickness of the substrate becomes not more than 400 μm, and the second surface can be a processed surface made by the processing. Alternatively, it can be a surface including an electrode formed on the processed surface.

In the method according to the other aspect of the present invention, in the step of forming the substrate product, the substrate is polished so that the thickness of the substrate becomes not less than 50 μm and not more than 100 μm, and the second surface can be a polished surface formed by the polishing. Alternatively, it can be a surface including an electrode formed on the polished surface.

When the substrate has such thickness, it is feasible to form the first and second end faces with flatness and perpendicularity enough to construct the laser cavity of the III-nitride semiconductor laser device, or without ion damage, in excellent yield.

In the method according to the other aspect of the present invention, more preferably, the angle ALPHA can fall within the range of not less than 63 degrees and not more than 80 degrees or within the range of not less than 100 degrees and not more than 117 degrees. When the angle is in the range of less than 63 degrees or in the range of more than 117 degrees, an m-plane can appear in part of an end face made by press. When the angle is in the range of more than 80 degrees and less than 100 degrees, the desired flatness and perpendicularity are not achieved.

In the method according to the other aspect of the present invention, preferably, the semipolar primary surface is any one of a {20-21} plane, a {10-11} plane, a {20-2-1} plane, and a {10-1-1} plane.

By use of these semipolar planes, it is also feasible to provide the first and second end faces with flatness and perpendicularity enough to construct the laser cavity of the III-nitride semiconductor laser device, or without ion damage.

In the method according to the other aspect of the present invention, the semipolar primary surface suitably applicable is a surface with a slight slant toward the m-plane in the range of not less than −4 degrees and not more than +4 degrees with respect to any one semipolar plane of a {20-21} plane, a {10-11} plane, a {20-2-1} plane, and a {10-1-1} plane.

By use of the slight slant surface from these typical semipolar planes, it is also feasible to provide the first and second end faces with flatness and perpendicularity enough to construct the laser cavity of the III-nitride semiconductor laser device, or without ion damage.

In the method according to the other aspect of the present invention, the scribing is carried out using a laser scriber, the scribing forms a scribed groove, and a length of the scribed groove is shorter than a length of a line of intersection between the first surface and an a-n plane defined by the normal axis and the a-axis of the hexagonal III-nitride semiconductor.

According to this method, the other substrate product and the laser bar are formed by fracture of the substrate product. This fracture is brought about by using the scribed groove shorter than a fracture line of the laser bar.

In the method according to the other aspect of the present invention, an end face of the active layer in each of the first and second end faces can make an angle with respect to a reference plane in the range of not less than (ALPHA−5) degrees and not more than (ALPHA+5) degrees on a plane defined by the c-axis and the m-axis of the hexagonal III-nitride semiconductor, and the reference plane is perpendicular to the m-axis of the support base of the hexagonal nitride semiconductor.

This method allows for forming the end faces with perpendicularity as mentioned above, as to the angle taken from one of the c-axis and the m-axis to the other.

In the method according to the other aspect of the present invention, the substrate comprises any one of GaN, AlN, AlGaN, InGaN, and InAlGaN. In this method, the substrate comprising one of these GaN-based semiconductors can provide the first and second end faces that are applicable to the cavity.

In the method according to the other aspect of the present invention, the substrate comprises an orientation flat indicative of an a-plane of the hexagonal III-nitride semiconductor, and the mark may include the orientation flat. In the method according to the present invention, the substrate comprises a cleaved facet extending along the a-plane of the hexagonal III-nitride semiconductor, and the mark may comprise the cleaved facet. Furthermore, in the method according to the present invention, in the step of forming the substrate product, a laser beam is applied to the substrate product to form laser marks arrayed in the direction of the a-axis of the hexagonal III-nitride semiconductor, and the mark may comprise an array of the laser marks. In the method according to the present invention, the laser structure exhibits a streaky emission image extending in a direction of a predetermined axis in a fluorescence microscope image based on photoexcitation with a mercury lamp; a direction of the array of the laser marks is determined based on the direction of the predetermined axis of the streaky emission image; an angle difference between the waveguide vector and a direction orthogonal to the predetermined axis can be in the range of not less than −0.5 degrees and not more than +0.5 degrees.

Still another aspect of the present invention relates to an epitaxial substrate for a III-nitride semiconductor laser device. This epitaxial substrate comprises: (a) a substrate with a semipolar primary surface of a hexagonal III-nitride semiconductor; and (b) a semiconductor laminate provided on the semipolar primary surface of the substrate. The semiconductor laminate comprises a semiconductor region for a laser structure; the semiconductor region comprises a first cladding layer comprised of a first conductivity type GaN-based semiconductor, a second cladding layer comprised of a second conductivity type GaN-based semiconductor, and an active layer provided between the first cladding layer and the second cladding layer; the first cladding layer, the second cladding layer, and the active layer are arranged along an axis normal to the semipolar primary surface; the active layer comprises a GaN-based semiconductor layer; the c-axis of the hexagonal III-nitride semiconductor of the substrate is inclined at an angle ALPHA with respect to the normal axis toward the m-axis of the hexagonal III-nitride semiconductor; the angle between the normal axis and the c-axis of the hexagonal III-nitride semiconductor is in the range of not less than 45 degrees and not more than 80 degrees or in the range of not less than 100 degrees and not more than 135 degrees; the semiconductor laminate comprises a structure extending along a reference axis indicative of a direction of the a-axis of the hexagonal III-nitride semiconductor.

This epitaxial substrate is suitable for the III-nitride semiconductor laser device including a laser stripe along a direction of the m-n plane that is defined by the m-axis of the hexagonal III-nitride semiconductor and the normal axis. In this epitaxial substrate, the angle between the normal axis and the c-axis of the hexagonal III-nitride semiconductor is in the range of not less than 45 degrees and not more than 80 degrees or in the range of not less than 100 degrees and not more than 135 degrees. However, since the semiconductor laminate comprises the stripe-like structure extending along the reference axis indicative of the direction of the a-axis of the hexagonal III-nitride semiconductor, this structure can provide the III-nitride semiconductor laser device, fabricated using this epitaxial substrate, with a reference mark for directing of the laser stripe or directing of the laser cavity.

In the other aspect of the present invention, the structure preferably has a length of not less than 230 μm in the direction of the a-axis. In this epitaxial substrate, the structure in the length of not less than 230 μm is preferable for mask alignment in fabrication of the III-nitride semiconductor laser device.

In the other aspect of the present invention, the structure can have a surface morphology extending in the direction of the a-axis in a top surface of the semiconductor laminate. In this epitaxial substrate, the structure has the surface morphology on the epitaxial surface of the epitaxial substrate, and thus the location of the structure can be specified by observation of the appearance of the epitaxial substrate.

In the other aspect of the present invention, the structure can comprise a depression in the top surface of the semiconductor laminate. Since the structure comprises the depression in this epitaxial substrate, the location of the depression can be found out by a transmission or a reflection image of light, e.g., in the range from ultraviolet light through the visible light to infrared light.

In the other aspect of the present invention, the structure can be provided at a position of a stacking fault arriving at the top surface of the semiconductor laminate. In this epitaxial substrate, since the structure is formed at the position of the stacking fault arriving at the top surface of the semiconductor laminate, crystallographic information is reflected in the shape, orientation, etc. of the structure.

In the other aspect of the present invention, the structure preferably makes an angle difference in the range of not less than −0.5 degrees and not more than +0.5 degrees with respect to the direction of the a-axis. Furthermore, in the other aspect of the present invention, the structure more preferably makes the angle difference in the range of not less than −0.3 degrees and not more than +0.3 degrees with respect to the direction of the a-axis. In this epitaxial substrate, for example, the aforementioned stacking fault has variation at the level of the aforementioned angle range.

In the other aspect of the present invention, the structure can comprise a defect region observed as a dark region in an emission image based on excitation with a mercury lamp. In this epitaxial substrate, the defect region includes a defect associated with crystal growth and thus crystallographic information is reflected in the shape, orientation, etc. of the structure. In the other aspect of the present invention, the dark region has a feature to expand by a thermal treatment at a high temperature of not less than 800 degrees Celsius.

In the other aspect of the present invention, preferably, a longer side of the dark region in the emission image extends in the direction of the reference axis and the longer side has a length of not less than 230 μm. In this epitaxial substrate, the structure that has the length of not less than 230 μm is preferable for mask alignment in fabrication of the III-nitride semiconductor laser device.

In the other aspect of the present invention, an angle difference between the longer side and the direction of the a-axis is preferably in the range of not less than −0.5 degrees and not more than +0.5 degrees. Furthermore, in the other aspect of the present invention, the angle difference between the longer side and the direction of the a-axis is more preferably in the range of not less than −0.3 degrees and not more than +0.3 degrees. In this epitaxial substrate, the aforementioned dark region has variation at the level of the foregoing angle range.

In the other aspect of the present invention, the dark region can comprise a crystal defect in the active layer. In this epitaxial substrate, the crystal defect is likely to be introduced to the active layer because of growth temperature or the quantum well structure, and this crystal defect is applicable to mask alignment.

In the other aspect of the present invention, a shape of a cross-section taken along a plane perpendicular to the a-axis can be hexagonal at least in part of the crystal defect. In this epitaxial substrate, the crystal defect is likely to be introduced to the active layer because of the growth temperature or the quantum well structure, and the shape of this crystal defect reflects crystallographic information.

Another aspect of the present invention relates to a method for fabricating a III-nitride semiconductor laser device. This method comprises the steps of: (a) preparing the foregoing epitaxial substrate; (b) forming a substrate product with an anode electrode and a cathode electrode, using the epitaxial substrate; (c) forming a scribed mark, a direction of which is determined with reference to the structure, on the substrate product; and (d) performing breakup of the substrate product by press on the substrate product to form another substrate product and a laser bar. The laser bar has first and second end faces which are formed by the breakup; the first and second end faces constitute a laser cavity of the III-nitride semiconductor laser device; the substrate product comprises a laser structure which includes the substrate having the semipolar primary surface of the hexagonal III-nitride semiconductor, and the semiconductor region formed on the semipolar primary surface; the anode electrode and the cathode electrode are formed on the laser structure; the first and second end faces intersect with the m-n plane that is defined by the m-axis of the hexagonal III-nitride semiconductor and the normal axis.

According to this method, the angle between the normal axis and the c-axis of the hexagonal III-nitride semiconductor is in the range of not less than 45 degrees and not more than 80 degrees or in the range of not less than 100 degrees and not more than 135 degrees, and the scribed mark whose direction is defined with reference to the structure formed in the epitaxial region in the fabrication of the epitaxial substrate can be formed on the substrate product.

In the method according to the other aspect of the present invention, the step of forming the substrate product comprises the step of forming an insulating film which covers the semiconductor region of the laser structure; an aperture of the stripe shape a direction of which is defined with reference to the structure is formed in the insulating film; either one of the anode electrode and the cathode electrode can be in contact with the laser structure through the aperture of the insulating film. According to this method, the stripe-shaped aperture whose direction is defined with reference to the structure in the epitaxial substrate can be formed in the insulating film.

In the method according to the other aspect of the present invention, the semiconductor region of the laser structure has a ridge structure; the ridge structure has a stripe shape; in formation of the ridge structure, a direction of the stripe shape of the ridge structure can be defined with reference to the structure. This method permits formation of the ridge structure the direction of which is defined with reference to the structure in the epitaxial substrate.

In yet another aspect of the present invention, a III-nitride semiconductor epitaxial substrate comprises: (a) a laser structure which includes a support base, comprising a hexagonal III-nitride semiconductor and having a semipolar primary surface, and a semiconductor region provided on the semipolar primary surface of the support base. The semiconductor region comprises a first cladding layer of a first conductivity type GaN-based semiconductor, a second cladding layer of a second conductivity type GaN-based semiconductor, and an active layer provided between the first cladding layer and the second cladding layer; the first cladding layer, the second cladding layer, and the active layer are arranged along an axis normal to the semipolar primary surface; the active layer comprises a GaN-based semiconductor layer; the c-axis of the hexagonal III-nitride semiconductor of the support base is inclined at an angle ALPHA with respect to the normal axis toward the m-axis of the hexagonal III-nitride semiconductor; the angle between the normal axis and the c-axis of the hexagonal III-nitride semiconductor is in the range of not less than 45 degrees and not more than 80 degrees or in the range of not less than 100 degrees and not more than 135 degrees; the epitaxial substrate includes a surface morphology extending in parallel with a direction of the a-axis. In this epitaxial substrate, the surface morphology preferably has a length of not less than 230 μm in the direction of the a-axis. In this epitaxial substrate, an angle difference between the surface morphology and the direction of the a-axis is preferably in the range of not less than −0.5 degrees and not more than +0.5 degrees. In this epitaxial substrate, the angle difference between the directions of the surface morphology and the a-axis is preferably in the range of not less than −0.3 degrees and not more than +0.3 degrees. In this epitaxial substrate, the surface morphology preferably includes a depression in observation of a cross section from the direction of the a-axis.

In another aspect of the present invention, a III-nitride semiconductor epitaxial substrate comprises: (a) a laser structure which includes a support base comprising a hexagonal III-nitride semiconductor and having a semipolar primary surface, and a semiconductor region provided on the semipolar primary surface of the support base. The semiconductor region comprises a first cladding layer of a first conductivity type GaN-based semiconductor, a second cladding layer of a second conductivity type GaN-based semiconductor, and an active layer provided between the first cladding layer and the second cladding layer; the first cladding layer, the second cladding layer, and the active layer are arranged along an axis normal to the semipolar primary surface; the active layer comprises a GaN-based semiconductor layer; the c-axis of the hexagonal III-nitride semiconductor of the support base is inclined at an angle ALPHA with respect to the normal axis toward the m-axis of the hexagonal III-nitride semiconductor; the angle between the normal axis and the c-axis of the hexagonal III-nitride semiconductor is in the range of not less than 45 degrees and not more than 80 degrees or in the range of not less than 100 degrees and not more than 135 degrees; a triangular or pentagonal dark region axisymmetric with respect to the c-axis is observed in an emission image based on excitation with a mercury lamp. In this epitaxial substrate, a long side of the dark region in the emission image extends in a direction of the a-axis and has a length of not less than 230 μm in the direction of the a-axis. In this epitaxial substrate, an angle difference between the long side and the direction of the a-axis is in the range of not less than −0.5 degrees and not more than +0.5 degrees.

In this epitaxial substrate, the angle difference between the long side and the direction of the a-axis is in the range of not less than −0.3 degrees and not more than +0.3 degrees. In this epitaxial substrate, the dark region is observed in a hexagonal shape in part of a crystal structure of a well layer in a cross section intersecting with the direction of the a-axis. In this epitaxial substrate, the dark region expands during execution of a thermal treatment at a high temperature of not less than 800 degrees Celsius.

BRIEF DESCRIPTION OF THE DRAWINGS

The above object and the other objects, features, and advantages of the present invention can more readily become clear in view of the following detailed description of the preferred embodiments of the present invention proceeding with reference to the accompanying drawings.

FIG. 13 is a drawing showing angles between (20-21) plane and other plane orientations (indices).

DETAILED DESCRIPTION OF THE PREFERRED EMBODIMENTS

The expertise of the present invention can be readily understood in view of the following detailed description with reference to the accompanying drawings provided by way of illustration only. The following will describe embodiments of the III-nitride semiconductor laser device and the method for fabricating the III-nitride semiconductor laser device according to the present invention, with reference to the accompanying drawings. The same portions will be denoted by the same reference symbols, if possible.

Figure 1:
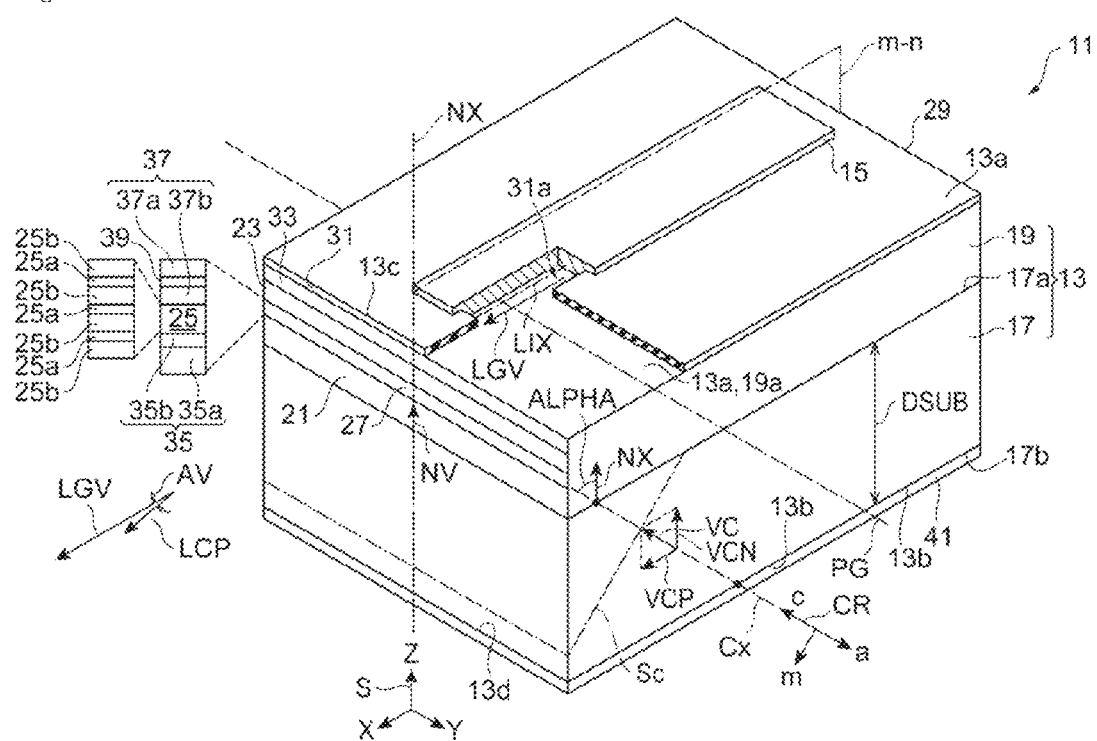
FIG. 1 is a drawing schematically showing a structure of a III-nitride semiconductor laser device according to an embodiment of the present invention.

FIG. 1 is a drawing schematically showing a structure of a III-nitride semiconductor laser device according to an embodiment of the present invention. The III-nitride semiconductor laser device 11 has a gain-guiding type structure, but embodiments of the present invention are not limited to the gain-guiding type structure. The III-nitride semiconductor laser device 11 has a laser structure 13 and an electrode 15. The laser structure 13 includes a support base 17 and a semiconductor region 19. The support base 17 comprises a hexagonal III-nitride semiconductor, and has a semipolar primary surface 17a and a back surface 17b. The semiconductor region 19 is provided on the semipolar primary surface 17a of the support base 17. The electrode 15 is provided on the semiconductor region 19 of the laser structure 13. The semiconductor region 19 includes a first cladding layer 21, a second cladding layer 23, and an active layer 25. The first cladding layer 21 comprises a first conductivity type GaN-based semiconductor, e.g., n-type AlGaN, n-type InAlGaN, or the like. The second cladding layer 23 comprises a second conductivity type GaN-based semiconductor, e.g., p-type AlGaN, p-type InAlGaN, or the like. The active layer 25 is provided between the first cladding layer 21 and the second cladding layer 23. The active layer 25 includes GaN-based semiconductor layers, and the GaN-based semiconductor layers are, for example, well layers 25a. The active layer 25 includes barrier layers 25b which comprise a GaN-based semiconductor, and the well layers 25a and the barrier layers 25b are alternately arranged. The well layers 25a comprise, for example, InGaN or the like, and the barrier layers 25b comprise, for example, GaN, InGaN, or the like. The active layer 25 can include a quantum well structure provided so as to generate light at the wavelength of not less than 360 nm and not more than 600 nm, and by making use of a semipolar surface, it is suitably applicable to generation of light at the wavelength of not less than 430 nm and not more than 550 nm. The first cladding layer 21, the second cladding layer 23, and the active layer 25 are arranged along a normal axis NX to the semipolar primary surface 17a. In the III-nitride semiconductor laser device 11, the laser structure 13 includes a first fractured face 27 and a second fractured face 29 which intersect with an m-n plane defined by the m-axis of the hexagonal III-nitride semiconductor and the normal axis NX.

Referring to FIG. 1, an orthogonal coordinate system S and a crystal coordinate system CR are depicted. The normal axis NX is directed along a direction of the Z-axis of the orthogonal coordinate system S. The semipolar primary surface 17a extends in parallel with a predetermined plane defined by the X-axis and the Y-axis of the orthogonal coordinate system S. In FIG. 1, a typical c-plane Sc is also depicted. The c-axis of the hexagonal III-nitride semiconductor of the support base 17 is inclined at an angle ALPHA of more than zero with respect to the normal axis NX toward the m-axis of the hexagonal III-nitride semiconductor. This c-axis direction is shown by a c-axis vector VC. The c-axis vector VC includes a projected component VCP parallel to the semipolar primary surface 17a and a normal component VCN parallel to the normal axis NX.

The III-nitride semiconductor laser device 11 further has an insulating film 31. The insulating film 31 covers a surface 19a of the semiconductor region 19 of the laser structure 13, and the semiconductor region 19 is located between the insulating film 31 and the support base 17. The support base 17 comprises a hexagonal III-nitride semiconductor. The insulating film 31 has an aperture 31a, and the aperture 31a extends in a direction of a line of intersection LIX between the surface 19a of the semiconductor region 19 and the foregoing m-n plane, and has, for example, a stripe shape. The electrode 15 is in contact with the surface 19a of the semiconductor region 19 (e.g., a contact layer 33 of the second conductivity type) through the aperture 31a, and extends in the direction of the foregoing line of intersection LIX. In the III-nitride semiconductor laser device 11, a laser waveguide includes the first cladding layer 21, the second cladding layer 23, and the active layer 25, and extends in the direction of the foregoing intersecting line LIX. For example, in the case of a gain guiding type laser, the aperture 31a of the insulating film 31 has, for example, the stripe shape, and the direction of the laser waveguide is the same as the direction in which the stripe aperture extends. In the case of a ridge type laser, the semiconductor region 19 of the laser structure 13 has the ridge structure, and the direction of the laser waveguide is the same as the direction in which this ridge structure extends. A waveguide vector LGV indicates the direction of the laser waveguide.

In the III-nitride semiconductor laser device 11, the first fractured face 27 and the second fractured face 29 intersect with the m-n plane that is defined by the m-axis of the hexagonal III-nitride semiconductor and the normal axis NX. A laser cavity of the III-nitride semiconductor laser device 11 includes the first and second fractured faces 27 and 29, and the laser waveguide extends from one of the first fractured face 27 and the second fractured face 29 to the other. The laser structure 13 includes a first surface 13a and a second surface 13b, and the first surface 13a is opposite to the second surface 13b. The first and second fractured faces 27 and 29 each extend from an edge 13c of the first surface 13a to an edge 13d of the second surface 13b. The first and second fractured faces 27 and 29 are different from the conventional cleaved facets such as c-planes, m-planes, or a-planes.

In this III-nitride semiconductor laser device 11, the first and second fractured faces 27, 29 forming the laser cavity intersect with the m-n plane. This allows for provision of the laser waveguide extending in the direction of the line of intersection between the m-n plane and the semipolar plane 17a. The III-nitride semiconductor laser device 11 has the laser cavity enabling a low threshold current.

In this III-nitride semiconductor laser device 11, the angle ALPHA between the normal axis NX and the c-axis of the hexagonal III-nitride semiconductor is in the range of not less than 45 degrees and not more than 80 degrees or in the range of not less than 100 degrees and not more than 135 degrees, and the laser structure 13 includes the laser waveguide that extends above the semipolar primary surface 17a of the support base 17. This laser waveguide extends in the direction of the waveguide vector LGV that is defined in the direction from one to the other of the first and second fractured faces 27 and 29. The c-axis vector VC indicating the direction of the c-axis of the hexagonal III-nitride semiconductor is defined by the projected component VCP parallel to the semipolar primary surface 17a, and the normal component VCN parallel to the normal axis NX. An angle difference AV between the waveguide vector LGV and the projected component VCP shown in FIG. 1 can be in the range of not less than −0.5 degrees and not more than +0.5 degrees.

In this III-nitride semiconductor laser device 11, the laser structure 13 shows a streaky emission image extending in a direction of a predetermined axis in a fluorescence microscope image generated by photo-excitation with a mercury lamp. An angle difference between the waveguide vector LGV and a direction orthogonal to the predetermined axis PG is in the range of not less than −0.5 degrees and not more than +0.5 degrees. In other words, the angle difference between the waveguide vector LGV and the predetermined axis direction PG is in the range of not less than 89.5 degrees and not more than 90.5 degrees.

When the angle difference AV is in the range of not less than −0.5 degrees and not more than +0.5 degrees, the lasing yield is improved. When the angle difference AV is in the range of not less than −0.3 degrees and not more than +0.3 degrees, the threshold variation is improved.

A mismatch between the direction of the end faces for the laser cavity and the direction of the laser waveguide degrades laser characteristics. If the angle difference AV between the projected component VCP of the c-axis vector and the waveguide vector LGV is nonzero, the end faces produced by fracture are unlikely to be perpendicular to the laser waveguide. Deterioration of perpendicularity degrades the laser characteristics or increases the characteristic variation. When parallelism between the waveguide vector LGV indicative of the direction of the laser waveguide and the c-axis projected component VCP is enhanced, it becomes feasible to improve the laser characteristic and to reduce the characteristic variation. For example, when the angle difference AV is in the range of not less than −0.5 degrees and not more than +0.5 degrees, the lasing yield can be 50% or more. When the angle difference AV is in the range of not less than −0.3 degrees and not more than +0.3 degrees, the threshold variation can be improved to 15% or less.

The III-nitride semiconductor laser device 11 includes an n-side optical guide layer 35 and a p-side optical guide layer 37. The n-side optical guide layer 35 includes a first portion 35a and a second portion 35b, and the n-side optical guide layer 35 comprises, for example, GaN, InGaN, or the like. The p-side optical guide layer 37 includes a first portion 37a and a second portion 37b, and the p-side optical guide layer 37 comprises, for example, GaN, InGaN, or the like. A carrier block layer 39 is provided, for example, between the first portion 37a and the second portion 37b. Another electrode 41 is provided on the back surface 17b of the support base 17, and the electrode 41 covers, for example, the back surface 17b of the support base 17.

Figure 2:
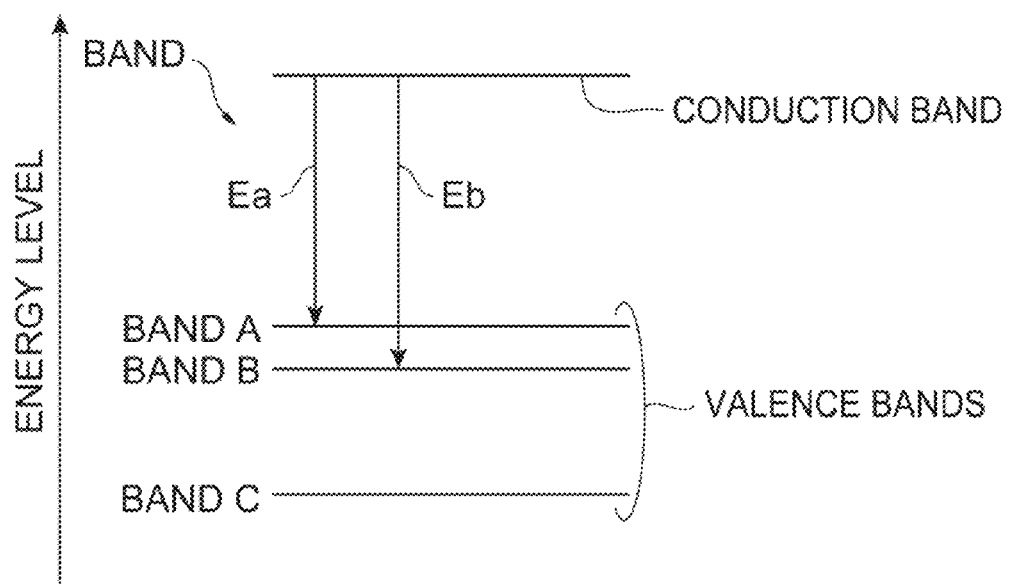
FIG. 2 is a drawing showing a band structure in an active layer in the III-nitride semiconductor laser device.
Figure 2:
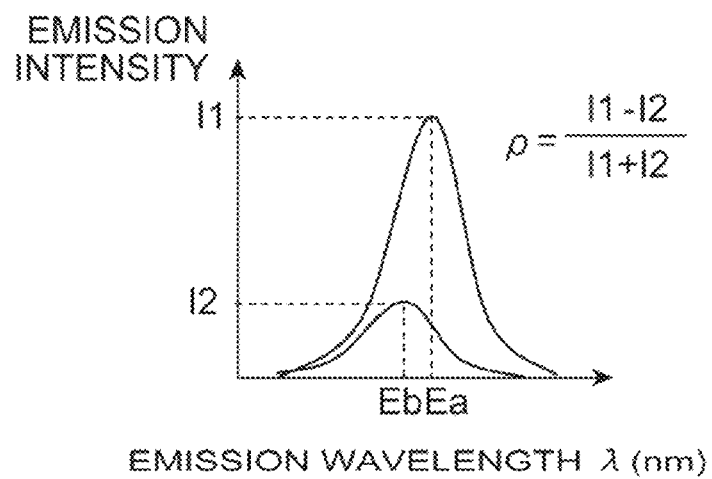
Figure 3:
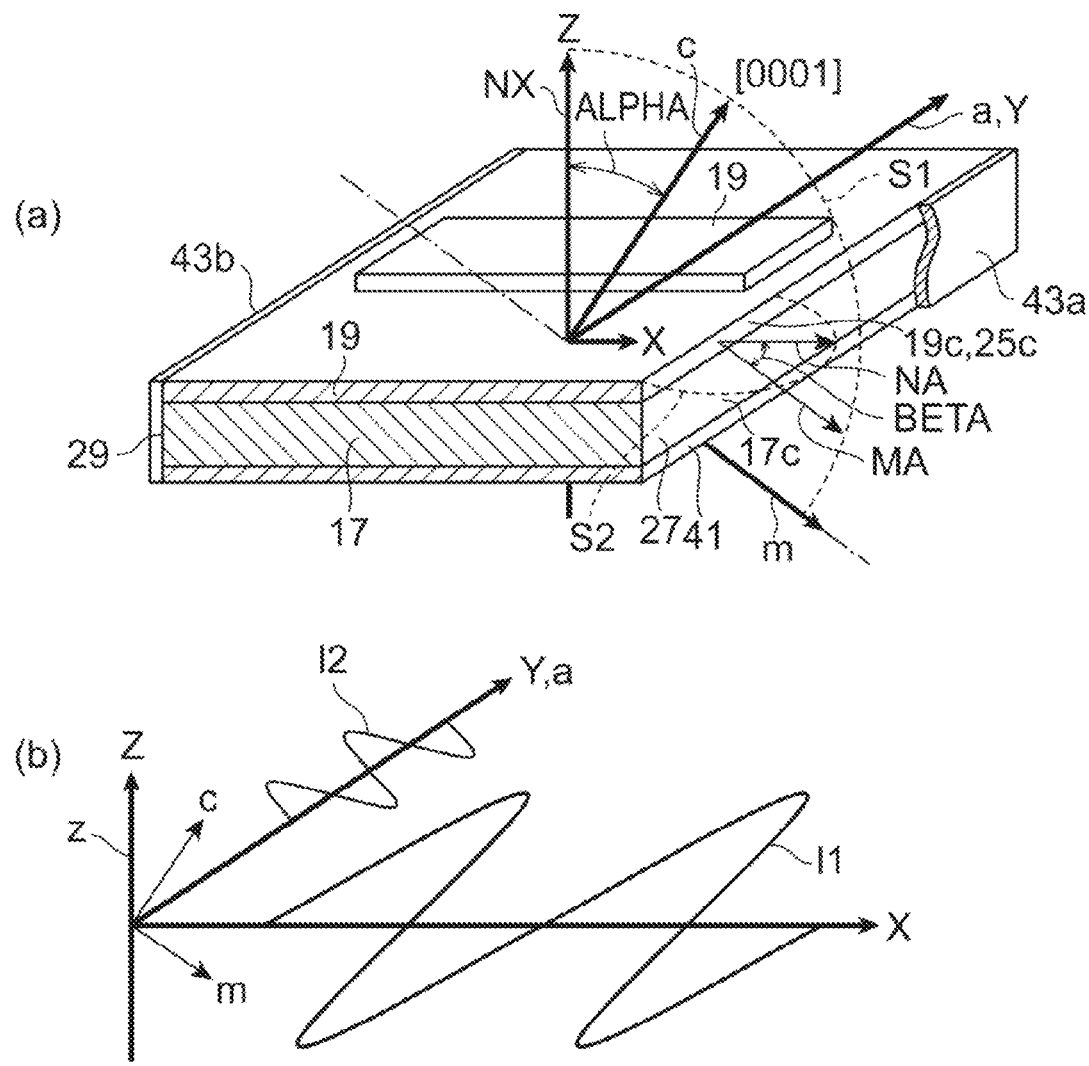
FIG. 3 is a drawing showing polarization of emission in the active layer of the III-nitride semiconductor laser device.
Figure 4:
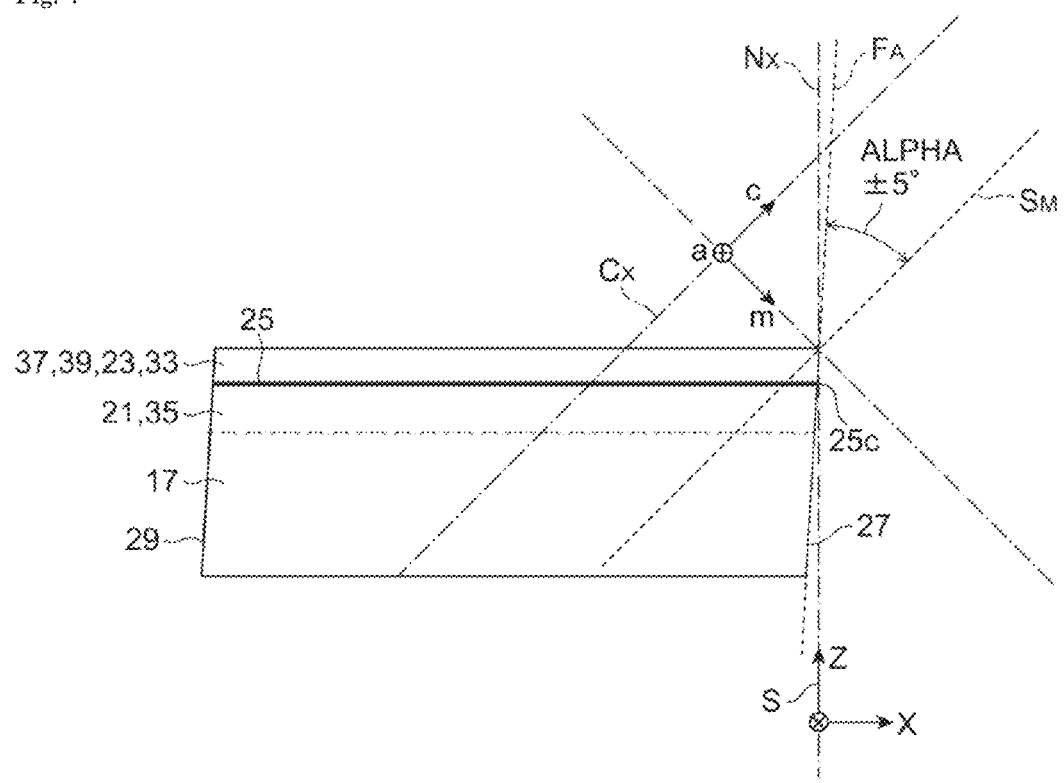
FIG. 4 is a drawing showing a relation between an end face of the III-nitride semiconductor laser device and an m-plane of the active layer.

FIG. 2 is a drawing showing a band structure in the active layer in the III-nitride semiconductor laser device. FIG. 3 is a drawing showing polarization of emission in the active layer 25 of the III-nitride semiconductor laser device 11. FIG. 4 is a drawing schematically showing a cross section defined by the c-axis and the m-axis. With reference to FIG. 2(a), there are three possible transitions between the conduction band and valence bands in the vicinity of Γ point of the band structure BAND. The energy difference between band A and band B is small. An emission by transition Ea between the conduction band and band A is polarized in the a-axis direction, and an emission by transition Eb between the conduction band and band B is polarized in the direction of the c-axis projected onto the primary surface. Concerning laser operation, a threshold of transition Ea is smaller than a threshold of transition Eb.

With reference to FIG. 2(b), there are shown spectra of light in the LED mode in the III-nitride semiconductor laser device 11. The light in the LED mode includes a polarization component I1 in the direction of the a-axis of the hexagonal III-nitride semiconductor, and a polarization component I2 in the direction of the projected c-axis of the hexagonal III-nitride semiconductor onto the primary surface, and the polarization component I1 is larger than the polarization component I2. Degree of polarization ρ is defined as (I1−I2)/(I1+I2). Using the laser cavity of the III-nitride semiconductor laser device 11, the device can be provided with lasing operation to emit light in a mode with large emission intensity in the LED mode.

As shown in FIG. 3, the device may be further provided with dielectric multilayer films 43a and 43b on at least one of the first and second fractured faces 27 and 29 or with both on the respective faces. An end face coat is also applicable to the fractured faces 27 and 29. The end face coat allows adjustment of reflectance.

As shown in FIG. 3(b), the laser light L from the active layer 25 is polarized in the direction of the a-axis of the hexagonal III-nitride semiconductor. In this III-nitride semiconductor laser device 11, a band transition allowing for implementation of a low threshold current has polarized nature. The first and second fractured faces 27 and 29 for the laser cavity are different from the conventional cleaved facets such as c-planes, m-planes, or a-planes. However, the first and second fractured faces 27 and 29 have flatness and perpendicularity enough as mirrors for the cavity. For this reason, by using the first and second fractured faces 27 and 29 and the laser waveguide extending between these fractured faces 27 and 29, as shown in FIG. 3(b), it becomes feasible to achieve low-threshold laser operation through the use of the emission by transition Ea, which is stronger than the emission by transition Eb polarized in the direction of the c-axis projected onto the primary surface.

In the III-nitride semiconductor laser device 11, an end face 17c of the support base 17 and an end face 19c of the semiconductor region 19 are exposed in each of the first and second fractured faces 27 and 29, and the end face 17c and the end face 19c are covered with the dielectric multilayer film 43a. An angle BETA between an m-axis vector MA of the active layer 25 and a vector NA normal to the end face 17c of the support base 17 and an end face 25c in the active layer 25 is defined by component $(BETA)_1$ defined in the first plane S1 defined by the c-axis and m-axis of the III-nitride semiconductor, and component $(BETA)_2$ defined in the second plane S2 (which is not shown but is referred to as "S2" for easier understanding) perpendicular to the normal axis NX and the first plane S1 (which is not shown but is referred to as "S1" for easier understanding). The component $(BETA)_1$ is preferably in the range of not less than (ALPHA−5) degrees and not more than (ALPHA+5) degrees on the first plane S1 defined by the c-axis and m-axis of the III-nitride semiconductor. This angle range is shown as an angle between a typical m-plane $S_M$ and a reference plane $F_A$ in FIG. 4. The typical m-plane $S_M$ is depicted from the inside to the outside of the laser structure in FIG. 4, for easier understanding. The reference plane $F_A$ extends along the end face 25c of the active layer 25. This III-nitride semiconductor laser device 11 has the end faces that satisfy the aforementioned perpendicularity, as to the angle BETA taken from one to the other of the c-axis and the m-axis. The component $(BETA)_2$ is preferably in the range of not less than −0.5 degrees and not more than +0.5 degrees and more preferably in the range of not less than −0.3 degrees and not more than +0.3 degrees on the second plane S2. Here, $BETA^2=(BETA)_1^2+(BETA)_2^2$. In this case, the end faces 27 and 29 of the III-nitride semiconductor laser device 11 satisfy the aforementioned perpendicularity as to the angle defined on the plane perpendicular to the axis NX normal to the semipolar plane 17a.

Referring again to FIG. 1, in the III-nitride semiconductor laser device 11 the thickness DSUB of the support base 17 is preferably not more than 400 μm. This III-nitride semiconductor laser device is suitable for obtaining excellent-quality fractured faces for the laser cavity. In the III-nitride semiconductor laser device 11, the thickness DSUB of the support base 17 is more preferably not less than 50 μm and not more than 100 μm. This III-nitride semiconductor laser device 11 is more suitable for obtaining excellent-quality fractured faces for the laser cavity. Furthermore, the handling becomes easier, and the production yield becomes higher.

In the III-nitride semiconductor laser device 11, the angle ALPHA between the normal axis NX and the c-axis of the hexagonal III-nitride semiconductor is preferably not less than 45 degrees and preferably not more than 80 degrees. Furthermore, the angle ALPHA is preferably not less than 100 degrees and preferably not more than 135 degrees. When the angle is in the range of less than 45 degrees or in the range of more than 135 degrees, the end faces made by press are highly likely to be comprised of m-planes. When the angle is in the range of more than 80 degrees and less than 100 degrees, it could result in failing to achieve the desired flatness and perpendicularity.

In the III-nitride semiconductor laser device 11, more preferably, the angle ALPHA between the normal axis NX and the c-axis of the hexagonal III-nitride semiconductor is not less than 63 degrees and not more than 80 degrees. Furthermore, the angle ALPHA is more preferably not less than 100 degrees and not more than 117 degrees. When the angle is in the range of less than 63 degrees or in the range of more than 117 degrees, an m-plane can appear in part of an end face made by press. When the angle is in the range of more than 80 degrees and less than 100 degrees, it could result in failing to achieve the desired flatness and perpendicularity.

The semipolar primary surface 17a can be any one of a {20-21} plane, a {10-11} plane, a {20-2-1} plane, and a {10-1-1} plane. Furthermore, a surface with a slight slant in the range of not less than −4 degrees and not more than +4 degrees with respect to these planes is also suitable for the primary surface. On the semipolar surface 17a of one of these typical planes, it is feasible to provide the first and second end faces 27 and 29 with flatness and perpendicularity enough to construct the laser cavity of the III-nitride semiconductor laser device 11. Furthermore, the end faces with sufficient flatness and perpendicularity are obtained in an angular range across these typical plane orientations.

In the III-nitride semiconductor laser device 11, the stacking fault density of the support base 17 can be not more than $1 \times 10^4$ cm$^{-1}$. Since the stacking fault density is not more than $1 \times 10^4$ cm$^{-1}$, the flatness and/or perpendicularity of the fractured faces is less likely to be disturbed for a certain accidental reason. The support base 17 can comprise any one of GaN, AlN, AlGaN, InGaN and InAlGaN. When the substrate made of any one of these GaN-based semiconductors is used, the end faces 27 and 29 applicable to the cavity can be obtained. When an AlN or AlGaN substrate is used, it is feasible to increase the degree of polarization and to enhance optical confinement by virtue of low refractive index. When an InGaN substrate is used, it is feasible to decrease the lattice mismatch between the substrate and the light emitting layer and to improve crystal quality.

Figure 5:
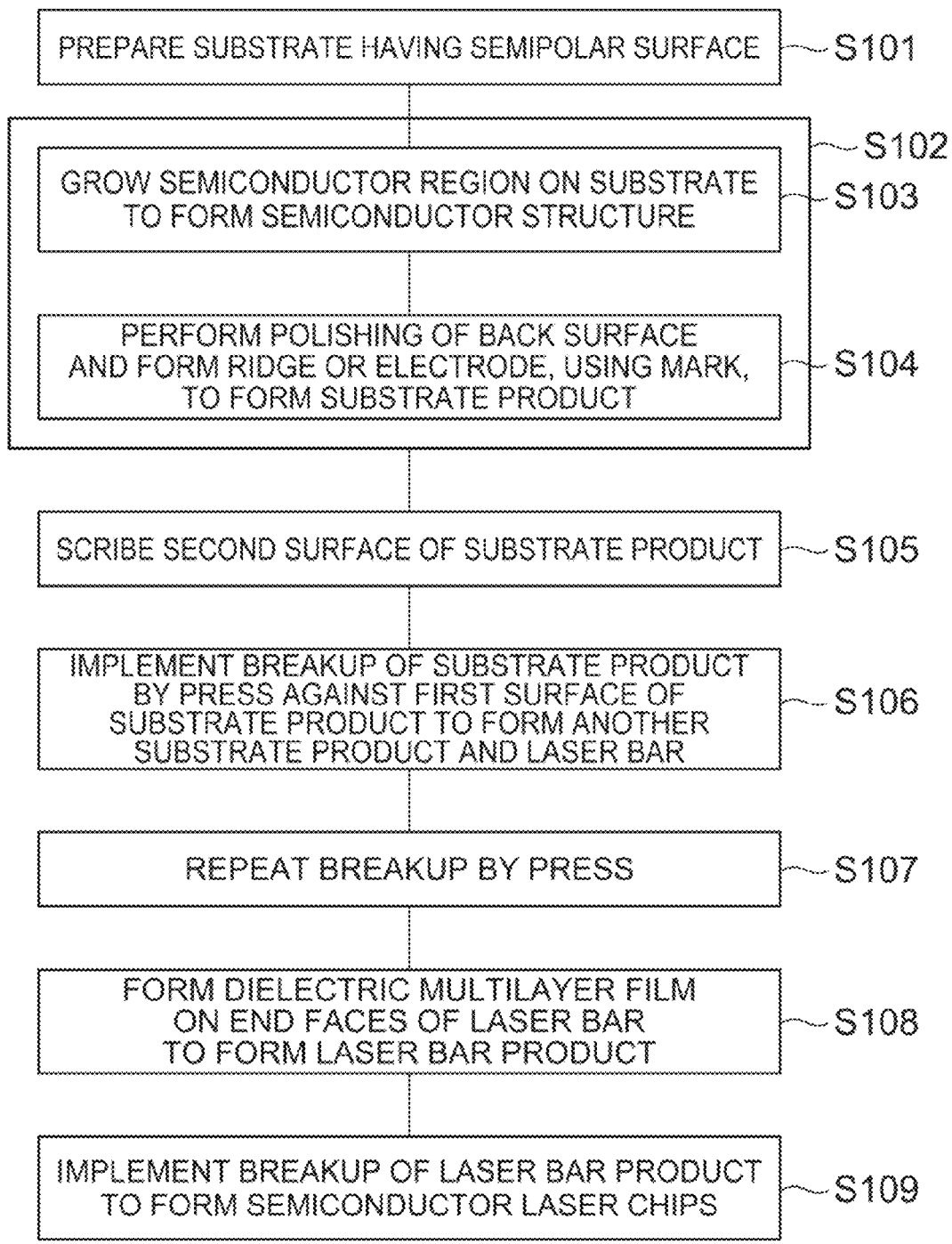
FIG. 5 is a step flowchart showing major steps in a method for fabricating a III-nitride semiconductor laser device according to an embodiment of the present invention.
Figure 6:
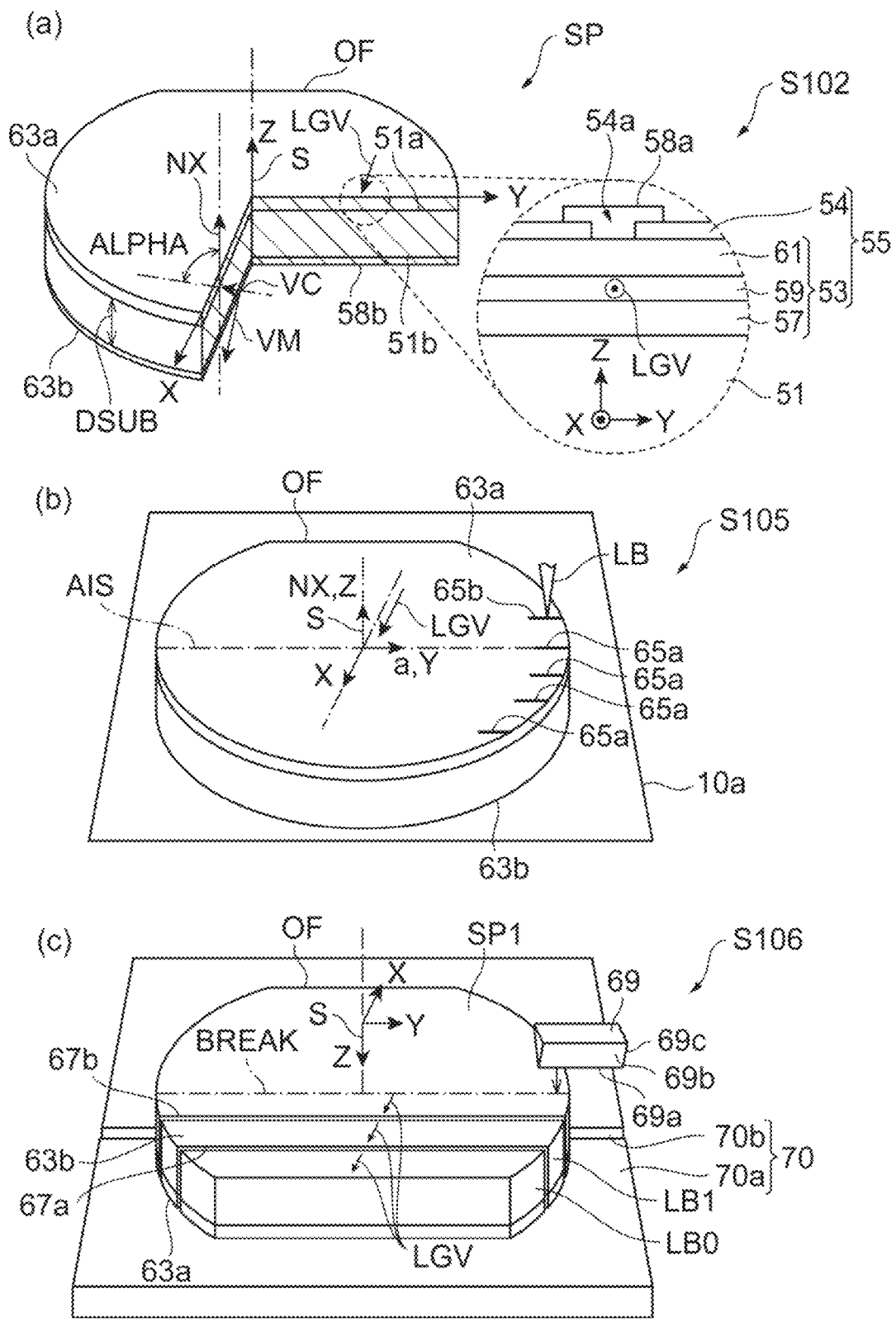
FIG. 6 is a drawing schematically showing major steps in the method for fabricating the III-nitride semiconductor laser device according to the embodiment.

FIG. 5 is a drawing showing major steps in a method for fabricating a III-nitride semiconductor laser device according to an embodiment of the present invention. With reference to FIG. 6(a), a substrate 51 is shown. In Step S101 the substrate 51 is prepared for fabrication of the III-nitride semiconductor laser device. The c-axis (vector VC) of the hexagonal III-nitride semiconductor of the substrate 51 is inclined at the finite angle ALPHA with respect to the normal axis NX toward the m-axis direction (vector VM) of the hexagonal III-nitride semiconductor. For this reason, the substrate 51 has a semipolar primary surface 51a of the hexagonal III-nitride semiconductor.

In Step S102, a substrate product SP is formed. In FIG. 6(a), the substrate product SP is depicted as a member of a nearly disklike shape, but the shape of the substrate product SP is not limited to this. For obtaining the substrate product SP, in step S103, a laser structure 55 is formed. The laser structure 55 includes a semiconductor region 53 and the substrate 51, and in step S103, the semiconductor region 53 is formed on the semipolar primary surface 51a. For forming the semiconductor region 53, a first conductivity type GaN-based semiconductor region 57, a light emitting layer 59, and a second conductivity type GaN-based semiconductor region 61 are grown in order on the semipolar primary surface 51a. The GaN-based semiconductor region 57 can include, for example, an n-type cladding layer, and the GaN-based semiconductor region 61 can include, for example, a p-type cladding layer. The light emitting layer 59 is provided between the GaN-based semiconductor region 57 and the GaN-based semiconductor region 61, and can include an active layer, optical guide layers, an electron block layer, and so on. The GaN-based semiconductor region 57, the light emitting layer 59, and the second conductivity type GaN-based semiconductor region 61 are arranged along the normal axis NX to the semipolar primary surface 51a. These semiconductor layers are epitaxially grown.

The substrate product SP includes a mark indicative of the direction of the m-axis or the a-axis of the hexagonal III-nitride semiconductor. This mark applicable herein can be, for example, an orientation flat (referred to as "OF") of the GaN substrate. After the semiconductor region 53 is formed on the semipolar primary surface 51a in the step of forming the substrate product SP, an array of laser marks indicative of the a-axis direction or the m-axis direction (e.g., a row of grooves formed by irradiation with a laser beam) can be formed in the epitaxial substrate including the semiconductor region 53, using a laser marker if necessary. The array of laser marks are preferably formed, for example, in parallel with OF of the wafer. The direction of this orientation flat indicates the a-axis direction or the m-axis direction. The array of laser marks is used as alignment mark. The laser marks are useful for achieving accurate parallelism between a waveguide stripe and OF in a subsequent photolithography process in which a mask aligner is used.

The top surface of the semiconductor region 53 is covered by insulating film 54. The insulating film 54 is made, for example, of silicon oxide. The insulating film 54 has an aperture 54a. The aperture 54a is, for example, of a stripe shape. The aperture 54a is formed, for example, by the photolithography process using the array of laser marks. When the ridge structure for the semiconductor laser is formed in the semiconductor region 53 of the epitaxial substrate, a mask for the ridge structure can be formed by the photolithography process using alignment with the array of laser marks. In formation of the substrate product SP, the direction of the laser waveguide (the direction of the waveguide vector LGV) is determined based on the aforementioned mark. For example, the extending direction of the aperture 54a of the insulating film 54 and the extending direction of the ridge structure are determined through photolithography based on the mark. These extending directions are coincident with the direction of the waveguide vector.

In Step S104, the ridge structure and/or electrodes (and a stripe window) are formed using the mark. For example, an anode electrode 58a and a cathode electrode 58b are formed on the laser structure 55. Before forming the electrode on the back surface of the substrate 51, the back surface of the substrate used in crystal growth is polished to form a substrate product SP in a desired thickness DSUB. In formation of the electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. These steps result in forming the substrate product SP. The substrate product SP includes a first surface 63a, and a second surface 63b located opposite thereto. The semiconductor region 53 is located between the first surface 63a and the substrate 51.

In Step S105, as shown in FIG. 6(b), the substrate product SP is scribed along the first surface 63a. This scribing step is carried out with a laser scriber 10a. This scribing step results in forming scribed grooves 65a. In FIG. 6(b), five scribed grooves are already formed, and formation of a scribed groove 65b is in progress with a laser beam LB. The length of the scribed grooves 65a is shorter than the length of a line of intersection AIS between the first surface 63a and an a-n plane defined by the normal axis NX and the a-axis of the hexagonal III-nitride semiconductor, and the laser beam LB is applied to a part of the line of intersection AIS. By the application with the laser beam LB, grooves extending in the specific direction are formed in the first surface 63a so as to reach the semiconductor region. The scribed grooves 65a can be formed, for example, at an edge of the substrate product SP.

In Step S106, as shown in FIG. 6(c), breakup of the substrate product SP is implemented by press against the second surface 63b of the substrate product SP to form a substrate product SP1 and a laser bar LB1. The press is carried out with a breaking device, for example, like a blade 69. The blade 69 includes an edge 69a extending in one direction, and at least two blade faces 69b and 69c which forms the edge 69a. The press on the substrate product SP1 is carried out on a support device 71. The support device 71 includes a support table 71a and a recess 71b, and the recess 71b extends in one direction. The recess 71b is formed in the support table 71a. The orientation and position of the scribed groove 65a of the substrate product SP1 are aligned with the extending direction of the recess 71b of the support device 71 to position the substrate product SP1 to the recess 71b on the support device 71. The orientation of the edge of the breaking device is aligned with the extending direction of the recess 71b, and the edge of the breaking device is pressed against the substrate product SP1 from a direction intersecting with the second surface 63b. The intersecting direction is preferably an approximately normal direction to the second surface 63b. This implements the breakup of the substrate product SP to form the substrate product SP1 and laser bar LB1. The press results in forming the laser bar LB1 with first and second end faces 67a and 67b, and these end faces 67a and 67b have perpendicularity and flatness enough to make at least a part of the light emitting layer applicable to the cavity mirrors of the semiconductor laser.

The laser bar LB1 thus formed has the first and second end faces 67a and 67b formed by the aforementioned breakup, and each of the end faces 67a and 67b extends from the first surface 63a to the second surface 63b. For this reason, the end faces 67a and 67b form the laser cavity of the III-nitride semiconductor laser device and intersect with an XZ plane. This XZ plane corresponds to the m-n plane defined by the normal axis NX and the m-axis of the hexagonal III-nitride semiconductor.

According to this method, the first surface 63a of the substrate product SP is scribed in the direction of the a-axis of the hexagonal III-nitride semiconductor, and thereafter the breakup of the substrate product SP is carried out by press against the second surface 63b of the substrate product SP, thereby forming the new substrate product SP1 and the laser bar LB1. For this reason, the first and second end faces 67a and 67b are formed in the laser bar LB1 so as to intersect with the m-n plane. This end face forming method provides the first and second end faces 67a and 67b with flatness and perpendicularity enough to construct the laser cavity of the III-nitride semiconductor laser device.

In this method, the laser waveguide thus formed extends in the direction in which the c-axis of the hexagonal III-nitride is inclined. The cavity mirror end faces allowing for provision of this laser waveguide are formed without use of dry-etched facets.

This method involves the fracture of the substrate product SP1, thereby forming the new substrate product SP1 and the laser bar LB1. In Step S107, the breakup by press is repeatedly carried out to produce a number of laser bars. This fracture is brought about using the scribed groove 65a shorter than a fracture line BREAK of the laser bar LB1.

In Step S108, dielectric multilayer films are formed on the end faces 67a and 67b of the laser bar LB1 to form a laser bar product. In Step S109, this laser bar product is broken into individual semiconductor laser chips.

In the fabrication method according to the present embodiment, the angle ALPHA can be in the range of not less than 45 degrees and not more than 80 degrees or in the range of not less than 100 degrees and not more than 135 degrees. When the angle is in the range of less than 45 degrees or in the range of more than 135 degrees, the end face made by press becomes highly likely to be comprised of an m-plane. When the angle is in the range of more than 80 degrees and less than 100 degrees, it could result in failing to achieve the desired flatness and perpendicularity. More preferably, the angle ALPHA can be in the range of not less than 63 degrees and not more than 80 degrees or in the range of not less than 100 degrees and not more than 117 degrees. When the angle is in the range of less than 45 degrees or in the range of more than 135 degrees, an m-plane can appear in part of an end face formed by press. When the angle is in the range of more than 80 degrees and less than 100 degrees, it could result in failing to achieve the desired flatness and perpendicularity. The semipolar primary surface 51a can be any one of a {20-21} plane, a {10-11} plane, a {20-2-1} plane, and a {10-1-1} plane. Furthermore, a surface with a slight slant in the range of not less than −4 degrees and not more than +4 degrees with respect to these planes is also suitable for the primary surface. On these typical semipolar planes, it is feasible to provide the end faces for the laser cavity with flatness and perpendicularity enough to construct the laser cavity of the III-nitride semiconductor laser device.

The substrate 51 can be comprised of any one of GaN, AlN, AlGaN, InGaN and InAlGaN. When the substrate used comprises any one of these GaN-based semiconductors, it is feasible to obtain the end faces applicable to the laser cavity. The substrate 51 is preferably made of GaN.

In the step S104 of forming the substrate product SP, the semiconductor substrate used in crystal growth can be one subjected to processing such as slicing or grinding such that the substrate thickness becomes not more than 400 μm, and the second surface 63b can be made of a processed surface formed by polishing. In this substrate thickness, the end faces 67a and 67b can be formed in excellent yield, with flatness and perpendicularity enough to construct the laser cavity of the III-nitride semiconductor laser device or without ion damage. More preferably, the second surface 63b is made of a polished surface formed by polishing, and the thickness of the polished substrate is not more than 100 μm. For relatively easily handling the substrate product SP, the substrate thickness is preferably not less than 50 μm.

In the production method of the laser end faces according to the present embodiment, the angle BETA explained with reference to FIG. 3 is also defined in the laser bar LB1. In the laser bar LB1, the component $(BETA)_1$ of the angle BETA is preferably in the range of not less than (ALPHA−5) degrees and not more than (ALPHA+5) degrees on the first plane (plane corresponding to the first plane S1 in the description with reference to FIG. 3) defined by the c-axis and m-axis of the III-nitride semiconductor. The end faces 67a and 67b of the laser bar LB1 satisfy the aforementioned perpendicularity as to the angle component of the angle BETA taken from one to the other of the c-axis and the m-axis. The component $(BETA)_2$ of the angle BETA is preferably in the range of not less than −5 degrees and not more than +5 degrees on the second plane (plane corresponding to the second plane S2 shown in FIG. 3). In this case, the end faces 67a and 67b of the laser bar LB1 satisfy the aforementioned perpendicularity as to the angle component of the angle BETA that is defined on the plane perpendicular to the normal axis NX to the semipolar surface 51a.

The end faces 67a and 67b are formed by break by press against the plural GaN-based semiconductor layers epitaxially grown on the semipolar surface 51a. Due to the epitaxial films grown onto the semipolar surface 51a, the end faces 67a and 67b are not cleaved facets with a low plane index like c-planes, m-planes, or a-planes, which have been used heretofore for the conventional cavity mirrors. However, through the break of the stack of epitaxial films on the semipolar surface 51a, the end faces 67a and 67b have the flatness and perpendicularity applicable as cavity mirrors.

EXAMPLE 1

A semipolar-plane GaN substrate is prepared, and perpendicularity of a fractured face is observed as described below. The substrate used is a {20-21}-plane GaN substrate cut at the angle of 75 degrees toward the m-axis out of a (0001) GaN ingot thickly grown by HVPE. The primary surface of the GaN substrate is mirror-finished, and the back surface is in a ground pear-skin state. The thickness of the substrate is 370 μm.

On the back side in the pear-skin state, a marking line is drawn, perpendicularly to the direction in which the c-axis is projected onto the primary surface of the substrate, with a diamond pen and thereafter the substrate is fractured by press. For observing the perpendicularity of the resultant fractured face, the substrate is observed with a scanning electron microscope from the direction that the a-plane faces.

Figure 7:
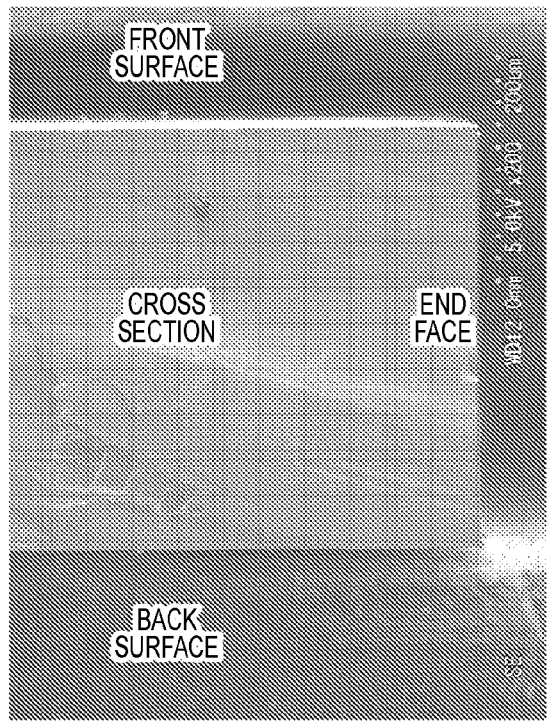
FIG. 7 is a drawing showing a scanning electron microscope image of a cavity end face, along with a {20-21} plane in crystal lattices.
Figure 7:
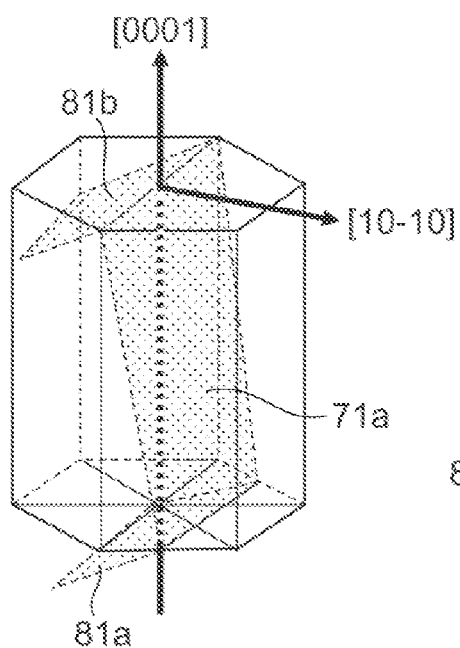
Figure 7:
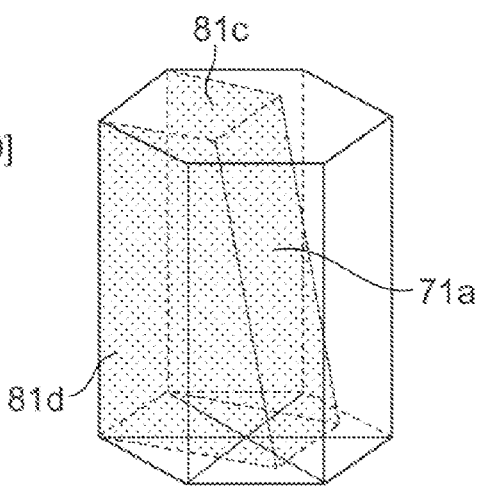

FIG. 7(a) is a scanning electron microscope image of the fractured face observed from the direction of the a-plane, and the right end face is the fractured face. It is seen that the fractured face has flatness and perpendicularity to the semipolar primary surface.

EXAMPLE 2

Figure 8:
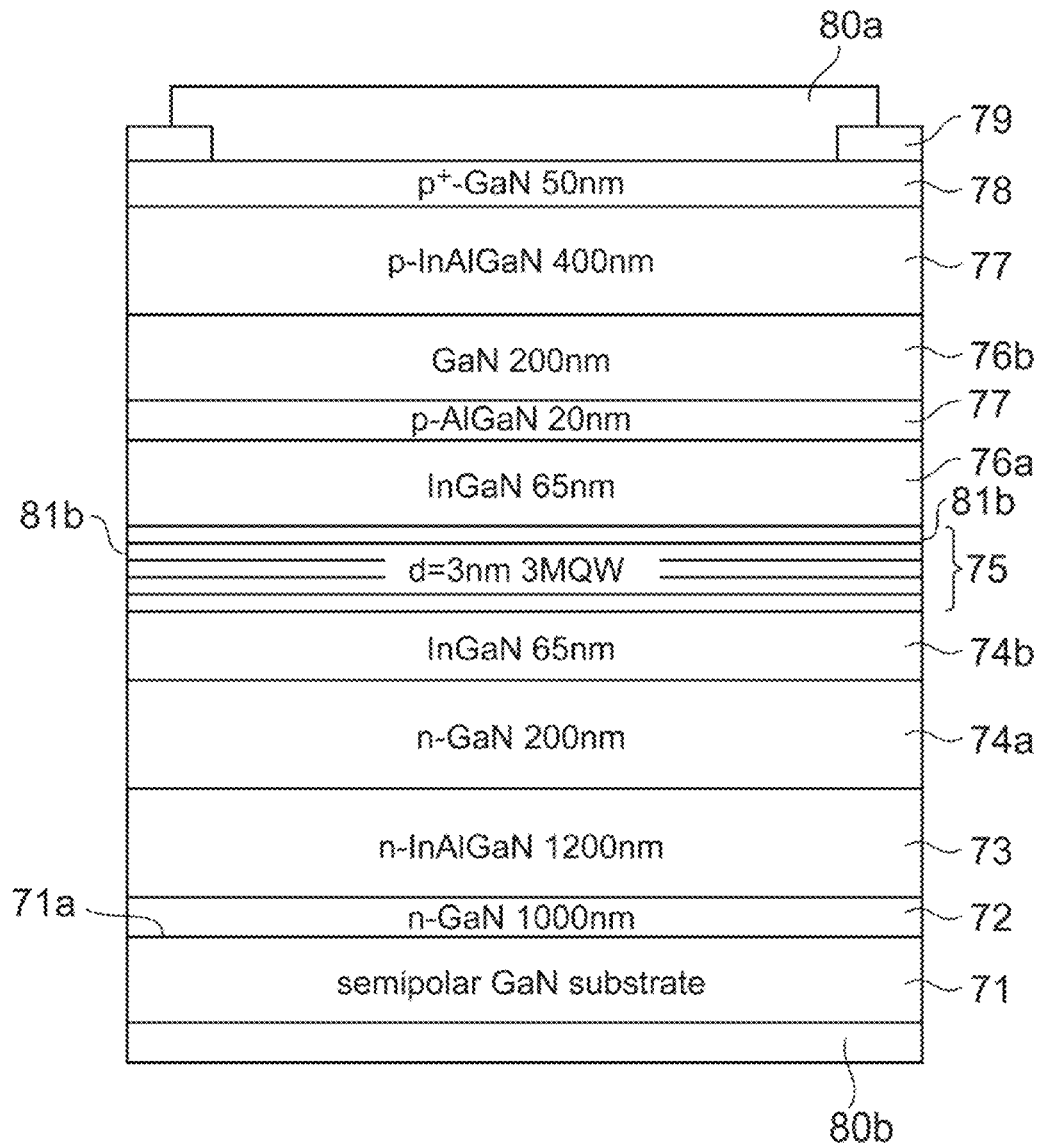
FIG. 8 is a drawing showing a structure of a laser diode shown in Example 1.

It is found in Example 1 that in the GaN substrate having the semipolar {20-21} surface, the fractured face is obtained by both drawing the marking line perpendicular to the direction in which the c-axis is projected onto the primary surface of the substrate and pressing the substrate and that the fractured face has the flatness and perpendicularity to the primary surface of the substrate. For checking applicability of this fractured face to the laser cavity, a laser diode shown in FIG. 8 is grown by metal-organic vapor phase epitaxy as described below. The raw materials used are trimethyl gallium (TMGa), trimethyl aluminum (TMAl), trimethyl indium (TMIn), ammonia ($NH_3$), and silane ($SiH_4$). A substrate 71 is prepared. The substrate 71 thus prepared is a GaN substrate cut out of a (0001) GaN ingot, thickly grown by HYPE, with a wafer slicing device at an angle in the range of 0 to 90 degrees toward the m-axis in such a manner that the angle ALPHA of inclination of the c-axis toward the m-axis has a desired off angle in the range of 0 to 90 degrees. For example, when the substrate is cut at the angle of 75 degrees, the resultant substrate is a {20-21}-plane GaN substrate and it is represented by reference symbol 71a in the hexagonal crystal lattice shown in FIG. 7(b).

Before the growth, the substrate is observed by the cathodoluminescence method in order to check the stacking fault density of the substrate. In the cathodoluminescence, an emission process of carriers excited by an electron beam is observed, and non-radiative recombination of carriers occurs in the vicinity of a stacking fault to be observed as a dark line. The stacking fault density is defined as a number of dark lines (line density) per unit length. The cathodoluminescence method of nondestructive measurement is applied herein in order to check the stacking fault density, but it is also possible to use a transmission electron microscope of destructive measurement. When a cross section of a sample is observed from the a-axis direction with the transmission electron microscope, a defect extending in the m-axis direction into the substrate toward the sample surface is a stacking fault contained in the support base, and the line density of stacking faults can be determined in the same manner as in the case of the cathodoluminescence method.

This substrate 71 is placed on a susceptor in a reactor, and epitaxial layers are grown according to the following growth procedure. First, an n-type GaN layer 72 is grown in the thickness of 1000 nm. Next, an n-type InAlGaN cladding layer 73 is grown in the thickness of 1200 nm on the GaN layer 72. Thereafter, an n-type GaN guide layer 74a and an undoped InGaN guide layer 74b are grown in the thickness of 200 nm and in the thickness of 65 nm, respectively, and then a three-cycle MQW 75 of GaN 15 nm thick/InGaN 3 nm thick is grown. Subsequently grown are an undoped InGaN guide layer 76a in the thickness of 65 nm, a p-type AlGaN block layer 77 in the thickness of 20 nm, and a p-type GaN guide layer 76b in the thickness of 200 nm. Then a p-type InAlGaN cladding layer 77 is grown in the thickness of 400 nm. Finally, a p-type GaN contact layer 78 is grown in the thickness of 50 nm.

An insulating film 79 of $SiO_2$ is grown on the contact layer 78, and then photolithography is used to form a stripe window in the width of 10 μm by wet etching In this step, two types of contact windows are formed along two stripe directions as follows: the laser stripe along (1) M-direction (direction of the contact window extending along the predetermined plane defined by the c-axis and the m-axis); and the laser stripe along (2) A-direction: <11-20>direction.

After the formation of the stripe window, a p-side electrode 80a of Ni/Au and a pad electrode of Ti/Al are made by vapor deposition. Next, the back surface of the GaN substrate (GaN wafer) is polished using a diamond slurry to produce a substrate product having a back surface polished in a mirror state. At this time, the thickness of the substrate product is measured with a contact film thickness meter. The measurement of thickness may also be carried out with a microscope through a sample cross section. The microscope applicable herein is an optical microscope or a scanning electron microscope. An n-side electrode 80b of Ti/Al/Ti/Au is formed by vapor deposition on the back surface (polished surface) of the GaN substrate (GaN wafer).

The cavity mirrors for these two types of laser stripes are produced with a laser scriber using the YAG laser of the wavelength of 355 nm. When the break is implemented with the laser scriber, the lasing chip yield can be improved as compared with the diamond scribing method. The conditions for formation of the scribed grooves are as follows: laser beam output of 100 mW; scanning speed of 5 mm/s. The scribed grooves thus formed are, for example, grooves having the length of 30 μm, the width of 10 μm, and the depth of 40 μm. The scribed grooves are formed by applying the laser beam directly to the epitaxially grown surface at the pitch of 800 μm and through the aperture of the insulating film of the substrate. The cavity length is 600 μm.

The cavity mirrors are made by fracture using a blade. A laser bar is produced by break by press against the back side of the substrate. More specifically, FIG. 7(b) and FIG. 7(c) show relations between crystal orientations and fractured faces, for the {20-21}-plane GaN substrate. FIG. 7(b) shows the case (1) where the laser stripe is provided in the M-direction and shows end faces 81a and 81b for the laser cavity along with the semipolar plane 71a. The end faces 81a and 81b are approximately perpendicular to the semipolar surface 71a, but are different from the conventional cleaved facets such as the hitherto-used c-planes, m-planes, or a-planes. FIG. 7(c) shows the case (2) where the laser stripe is provided in the <11-20> direction and shows end faces 81c and 81d for the laser cavity along with the semipolar plane 71a. The end faces 81c and 81d are approximately perpendicular to the semipolar surface 71a and are composed of a-planes.

The fractured faces made by the break are observed with a scanning electron microscope and no prominent unevenness is observed in each of the cases (1) and (2). From this result, the flatness (magnitude of unevenness) of the fractured faces is estimated to be not more than 20 nm. Furthermore, the perpendicularity of the fractured faces to the surface of the sample is within the range of ±5 degrees.

The end faces of the laser bar are coated with a dielectric multilayer film by vacuum vapor deposition. The dielectric multilayer film is composed of an alternate stack of $SiO_2$ and $TiO_2$. The thickness of each layer is adjusted in the range of 50 to 100 nm, and is designed so that the center wavelength of reflectance falls within the range of 500 to 530 nm. The reflecting surface on one side has ten cycles and the designed value of reflectance of about 95%, and the reflecting surface on the other side has six cycles and the designed value of reflectance of about 80%.

Evaluation by energization is carried out at room temperature. A power supply used works as a pulsed power source with the pulse width of 500 ns and the duty ratio of 0.1% and the energization is implemented with needles on the surface electrodes. On the occasion of light output measurement, the emission from the laser bar end face is detected with a photodiode to check the current-optical output characteristic (I-L characteristic). In measurement of emission wavelength, the emission from the laser bar end face is made to pass through an optical fiber and a spectrum thereof is measured using a spectrum analyzer as a detector. In checking a polarization state, the emission from the laser bar is made to pass through a polarizing plate to rotate, thereby checking the polarization state. In observation of LED-mode emission, an optical fiber is arranged toward the front side surface of the laser bar to measure light emitted from the front surface.

The polarization state in the lasing operation is checked for every laser, and this check finds that the light is polarized in the a-axis direction. The lasing wavelength is in a range of 500-530 nm.

Figure 9:
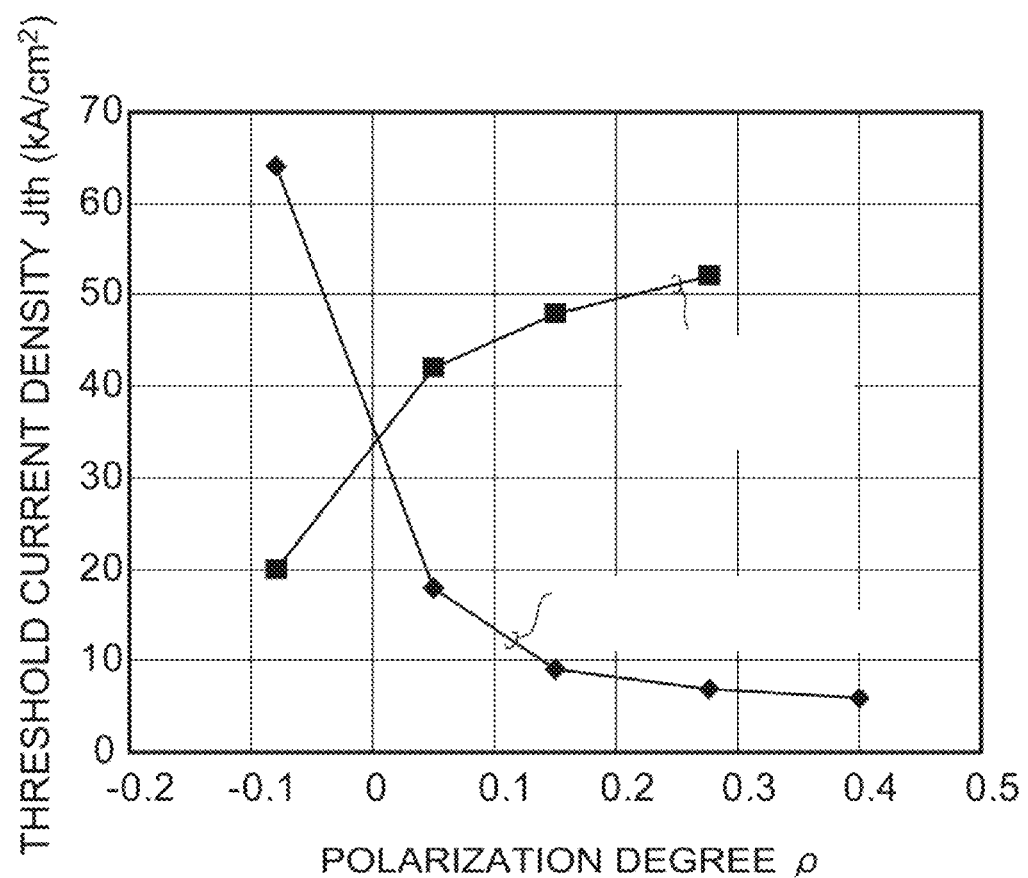
FIG. 9 is a drawing showing a relation of determined polarization degree ρ versus threshold current density.

The polarization state in the LED mode (spontaneous emission) is measured for every laser. When the polarization component in the a-axis direction is I1 and the polarization component in the direction of the projected m-axis onto the primary surface is I2, the polarization degree ρ is defined as (I1−I2)/(I1+I2). In this way, the relation between determined polarization degree ρ and minimum of threshold current density is investigated and the result obtained is as shown in FIG. 9. It is seen from FIG. 9 that the threshold current density demonstrates a significant decrease in the case (1) of the laser with the laser stripe along the M-direction when the polarization degree is positive. Namely, it is seen that when the polarization degree is positive (I1>I2) and when the waveguide is provided along an off direction, the threshold current density is significantly decreased.

The data shown in FIG. 9 is as described below.

| polarization degree, | threshold current (M-direction stripe) | threshold current (<11-20> stripe) |
|---|---|---|
| 0.08, | 64, | 20; |
| 0.05, | 18, | 42; |
| 0.15, | 9, | 48; |
| 0.276, | 7, | 52; |
| 0.4, | 6. | |

Figure 10:
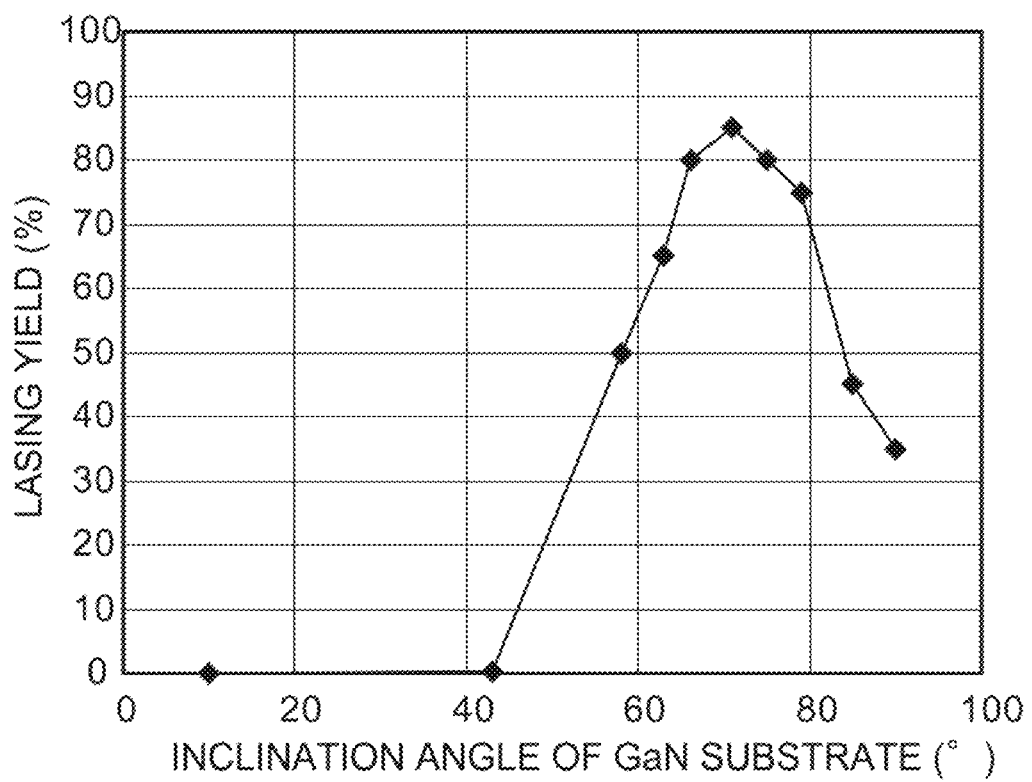
FIG. 10 is a drawing showing a relation of inclination angle of the c-axis toward the m-axis of GaN substrate versus lasing yield.

The relation between lasing yield and the inclination angle of the c-axis of the GaN substrate toward the m-axis is investigated, and the result obtained is as shown in FIG. 10. In the present example, the lasing yield is defined as (the number of lasing chips)/(the number of measured chips). FIG. 10 is a plot for lasers having the laser stripe along (1) the M-direction in substrates with the stacking fault density of substrate of not more than $1\times10^4$ (cm$^{-1}$). It is seen from FIG. 10 that the lasing yield is extremely low with the off angles of not more than 45 degrees. The end face state is observed with an optical microscope and the observation finds that an m-plane appeared in almost all chips at angles smaller than 45 degrees, resulting in failure in achieving perpendicularity. It is also seen that when the off angle is in the range of not less than 63 degrees and not more than 80 degrees, the perpendicularity is improved and the lasing yield increases to 50% or more. From these facts, the optimum range of off angle of the GaN substrate is not less than 63 degrees and not more than 80 degrees. The same result is also obtained in the range of not less than 100 degrees and not more than 117 degrees, which is an angular range to provide crystallographically equivalent end faces.

The data shown in FIG. 10 is as described below.

| inclination angle, | yield. |
|---|---|
| 10, | 0.1; |
| 43, | 0.2; |
| 58, | 50; |
| 63, | 65; |
| 66, | 80; |
| 71, | 85; |
| 75, | 80; |
| 79, | 75; |
| 85, | 45; |
| 90, | 35. |

Figure 11:
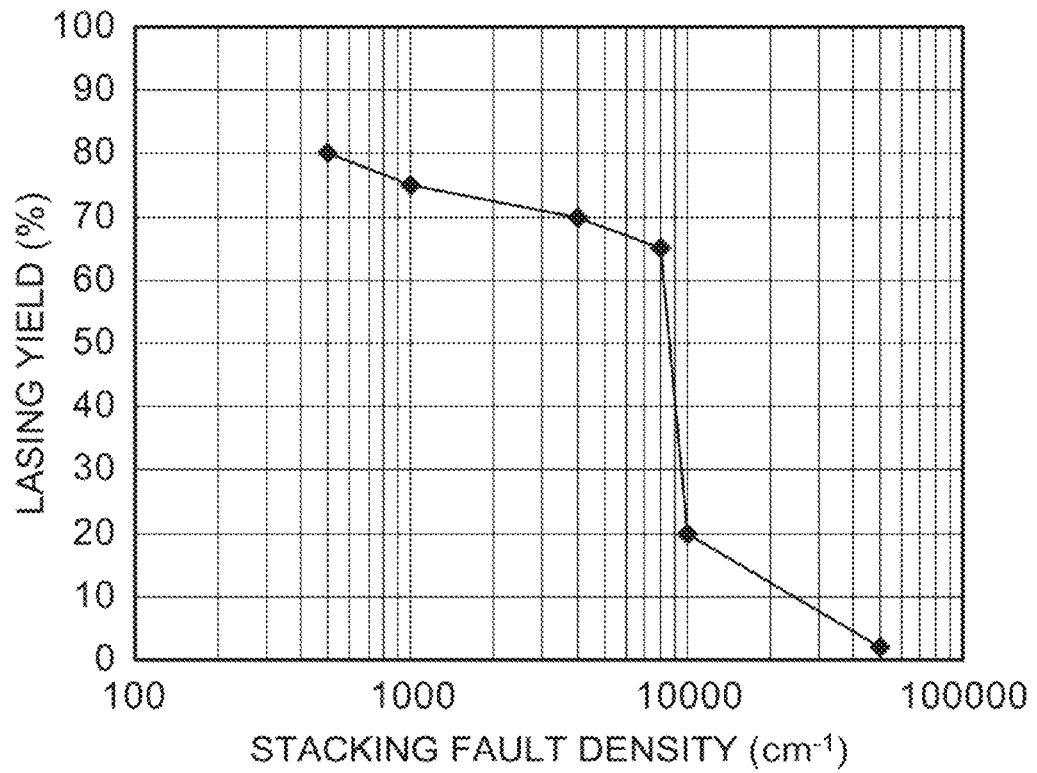
FIG. 11 is a drawing showing a relation of stacking fault density versus lasing yield.

The relation between stacking fault density and lasing yield is investigated, and the result obtained is as shown in FIG. 11. The definition of lasing yield is the same as above. It is seen from FIG. 11 that the lasing yield is suddenly decreased with the stacking fault density over $1\times10^4$ (cm$^{-1}$). When the end face state is observed with an optical microscope, it is found that with samples of the decreased lasing yield, the unevenness of the end faces is significant and no flat fractured faces are obtained. The reason may be that there is a difference in easiness of fracture because of the existence of stacking faults. From this result, the stacking fault density in the substrate needs to be not more than $1\times10^4$ (cm$^{-1}$).

The data shown in FIG. 11 is as described below.

| stacking fault density (cm$^{-1}$), | yield. |
|---|---|
| 500, | 80; |
| 1000, | 75; |
| 4000, | 70; |
| 8000, | 65; |
| 10000, | 20; |
| 50000, | 2. |

Figure 12:
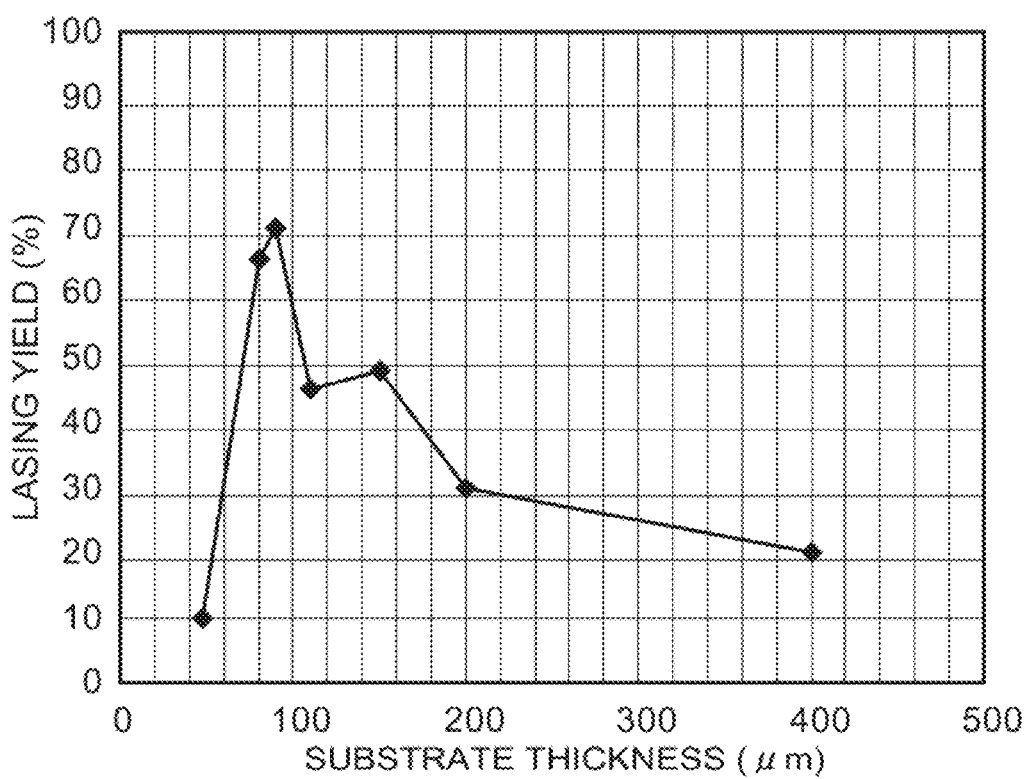
FIG. 12 is a drawing showing a relation of substrate thickness versus lasing yield.

The relation between substrate thickness and lasing yield is investigated, and the result obtained is as shown in FIG. 12. The definition of lasing yield is the same as above. FIG. 12 is a plot for lasers in which the stacking fault density of the substrate is not more than $1\times10^4$ (cm$^{-1}$) and in which the laser stripe extends along (1) the M-direction. From FIG. 12, the lasing yield is high when the substrate thickness is not more than 100 μm and not less than 50 μm. This is because the perpendicularity of fractured faces becomes deteriorated when the substrate thickness is larger than 100 μm. It is also because its handling becomes difficult and a chip becomes easy to break when the thickness is smaller than 50 μm. From these, the optimum thickness of the substrate is not less than 50 μm and not more than 100 μm.

The data shown in FIG. 12 is as described below.

| substrate thickness, | yield. |
|---|---|
| 48, | 10; |
| 80, | 65; |
| 90, | 70; |
| 110, | 45; |
| 150, | 48; |
| 200, | 30; |
| 400, | 20. |

EXAMPLE 3

In Example 2, the plural epitaxial films for the semiconductor laser are grown on the GaN substrate of the {20-21} plane. The end faces for the optical cavity are formed by the formation of scribed grooves and the press as described above. In order to find candidates for these end faces, plane orientations which make an angle near 90 degrees to the (20-21) plane and are different from the a-plane are determined by calculation. With reference to FIG. 13, the following angles and plane orientations have angles near 90 degrees to the (20-21) plane.

| Specific plane index, | Angle to {20-21} plane. |
|---|---|
| (-1016): | 92.46 degrees; |
| (-1017): | 90.10 degrees; |
| (-1018): | 88.29 degrees. |

EXAMPLE 4

A laser diode is grown by metal-organic vapor phase epitaxy as described below. The raw materials used herein are as follows: trimethyl gallium (TMGa); trimethyl aluminum (TMAl); trimethyl indium (TMIn); ammonia ($NH_3$); and silane ($SiH_4$). The substrate used herein is a 2-inch {20-21}-plane GaN substrate grown by HVPE. The GaN substrate has an orientation flat (hereinafter referred to as "OF") indicative of an a-plane. The surface accuracy that represents the angle difference between the OF plane and the a-plane is measured with a surface tester, and the surface accuracy is found to be not more than 0.1 degrees. Therefore, the direction of the projected component as a projection of the c-axis onto the primary surface of the GaN substrate and an end face of the a-plane (e.g., OF or, a cleaved facet of a-pane) are parallel to each other to the accuracy in the angle range of not less than −0.1 degrees and not more than +0.1 degrees.

Figure 14:
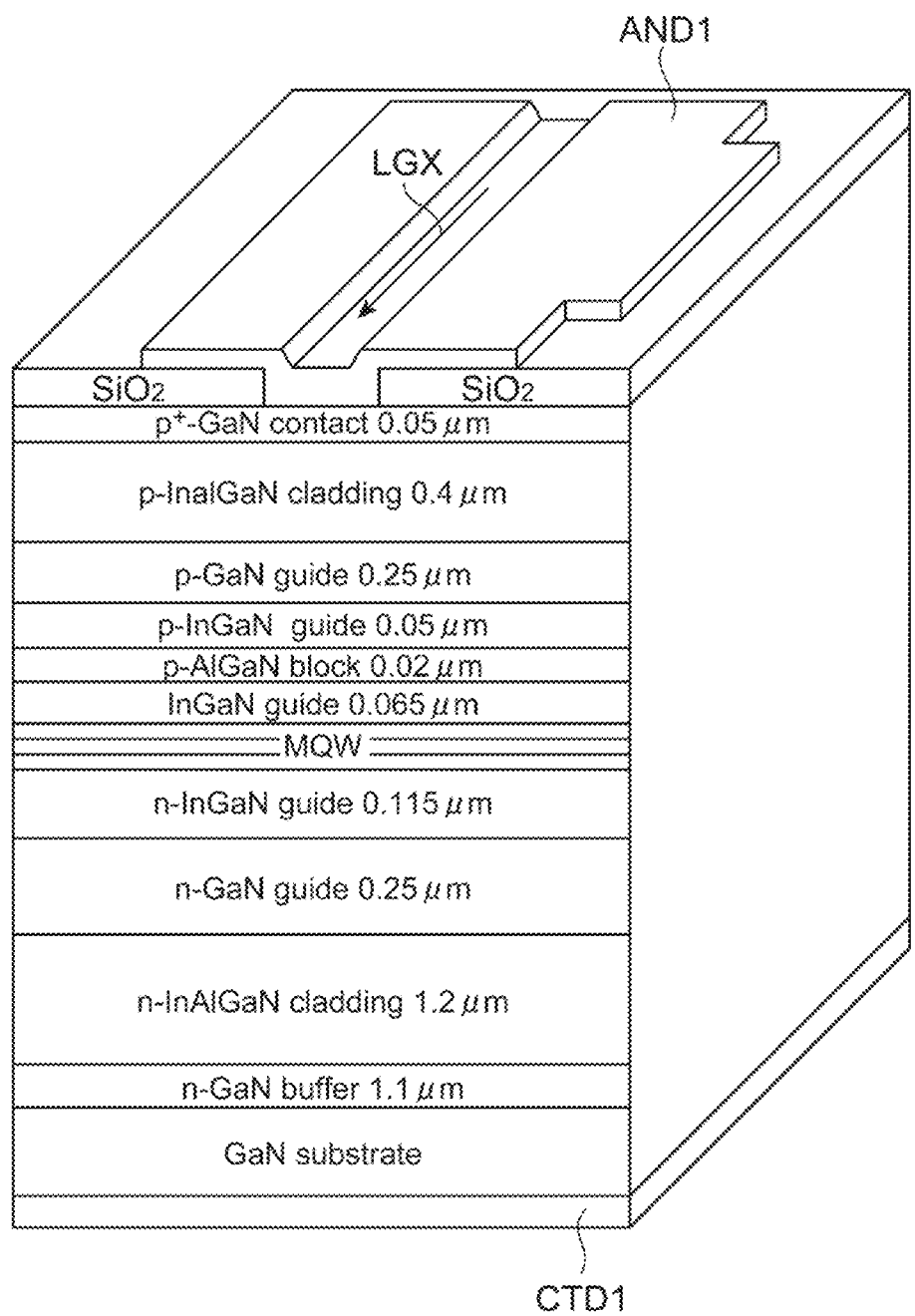
FIG. 14 is a drawing schematically showing a structure of a gain guiding type laser.

This GaN substrate is placed on a susceptor in a reactor and thereafter epitaxial layers for an epitaxial substrate, as shown in FIG. 14, are grown on the GaN substrate in accordance with the following growth procedure. First, an n-type GaN layer is grown in the thickness of 1100 nm. Next, an n-type InAlGaN cladding layer is grown in the thickness of 1200 nm. Thereafter, an n-type GaN guide layer and an n-type InGaN guide layer are grown in the thickness of 250 nm and in the thickness of 115 nm, respectively. Grown thereafter is a quantum well structure (two-cycle MQW) of GaN (10 nm thick)/InGaN (3 nm thick). Subsequently grown are an undoped InGaN guide layer in the thickness of 65 nm, a p-type AlGaN block layer in the thickness of 20 nm, a p-type InGaN guide layer in the thickness of 50 nm, and a p-type GaN guide layer in the thickness of 250 nm. Next, a p-type InAlGaN cladding layer is grown in the thickness of 400 nm. Finally, a p-type GaN contact layer is grown in the thickness of 50 nm. The epitaxial substrate is produced through this growth procedure.

For achieving accurate parallelism between the waveguide stripe and OF in a photolithography process carried out in a subsequent step using a mask aligner, plural laser marks arrayed in parallel with OF are formed on a predetermined line on the surface of the epitaxial substrate. Since the length of OF is, for example, about 15 mm and the accuracy of alignment of the laser marks is, for example, about 2 µm, the parallelism between OF and the laser marks has the accuracy in the range of not less than −0.01 degrees and not more than +0.01 degrees. This accuracy is one order of magnitude smaller than the accuracy of the direction of OF. For this reason, the accuracy of the direction of OF is virtually reflected in the accuracy of the parallelism between the direction of the waveguide stripe and the direction of the projected component as a projection of the c-axis onto the primary surface. When the semipolar GaN substrate used has no OF, the a-axis direction of this semipolar substrate can be determined as below. More specifically, the epitaxial substrate is cleaved to expose an a-plane of the GaN substrate, thereby determining the a-axis direction. When an edge produced by this cleavage is used as a reference, the direction of the laser waveguide can be accurately determined within the angle of not less than −0.1 degrees and not more than +0.1 degrees. Another applicable method is a method making use of a surface morphology. A linear surface morphology parallel to the a-axis can be observed in an epitaxial film grown on a semipolar surface. This surface morphology is formed so as to reflect a defect in the substrate, influence of an end of the substrate, or roughness of the surface of the substrate, and is observed with a fluorescence microscope by photoexcitation with a mercury lamp. A linear or streaky emission line is observed in a fluorescence microscope image. After the orientation of the epitaxial substrate is adjusted such that the direction of the morphology is made parallel to a scan direction of a laser marker, the epitaxial substrate is then rotated by an angle of 90 degrees therefrom, and a line of laser marks are formed with the laser marker. This method also allows the determination of the direction of the laser waveguide (the direction of the stripe window or the direction of the ridge) with the same accuracy. The direction of the array of laser marks can be determined with reference to a direction of an axis associated with the streaky emission image.

The determination of the direction of the array of laser marks (e.g., scribed marks) and the direction of the laser waveguide (the direction of the stripe window or the direction of the ridge) can be performed using a structure associated with a crystal defect formed during growth of semiconductor layers on the substrate, as described above.

An insulating film of $SiO_2$ is deposited on the contact layer, and thereafter photolithography is applied to form a stripe window in the width of 10 µm by wet etching. The direction of the stripe is determined with reference to the aforementioned laser marks. Specifically, patterning of the stripe window is carried out such that the stripe is made parallel to the laser marks or such that an angle difference therebetween is intentionally made. After the formation of the stripe window, a p-side electrode AND1 of Ni/Au and a pad electrode of Ti/Au are formed by vapor deposition. Next, the back surface of the GaN substrate (GaN wafer) is polished using a diamond slurry to produce a substrate product having the back surface polished in a mirror state. An n-side electrode CTD1 of Ti/Al/Ti/Au is formed by vapor deposition on the back surface (polished surface) of the GaN substrate (GaN wafer). The substrate product for a gain guiding type laser can be fabricated through the procedure of these steps.

Figure 15:
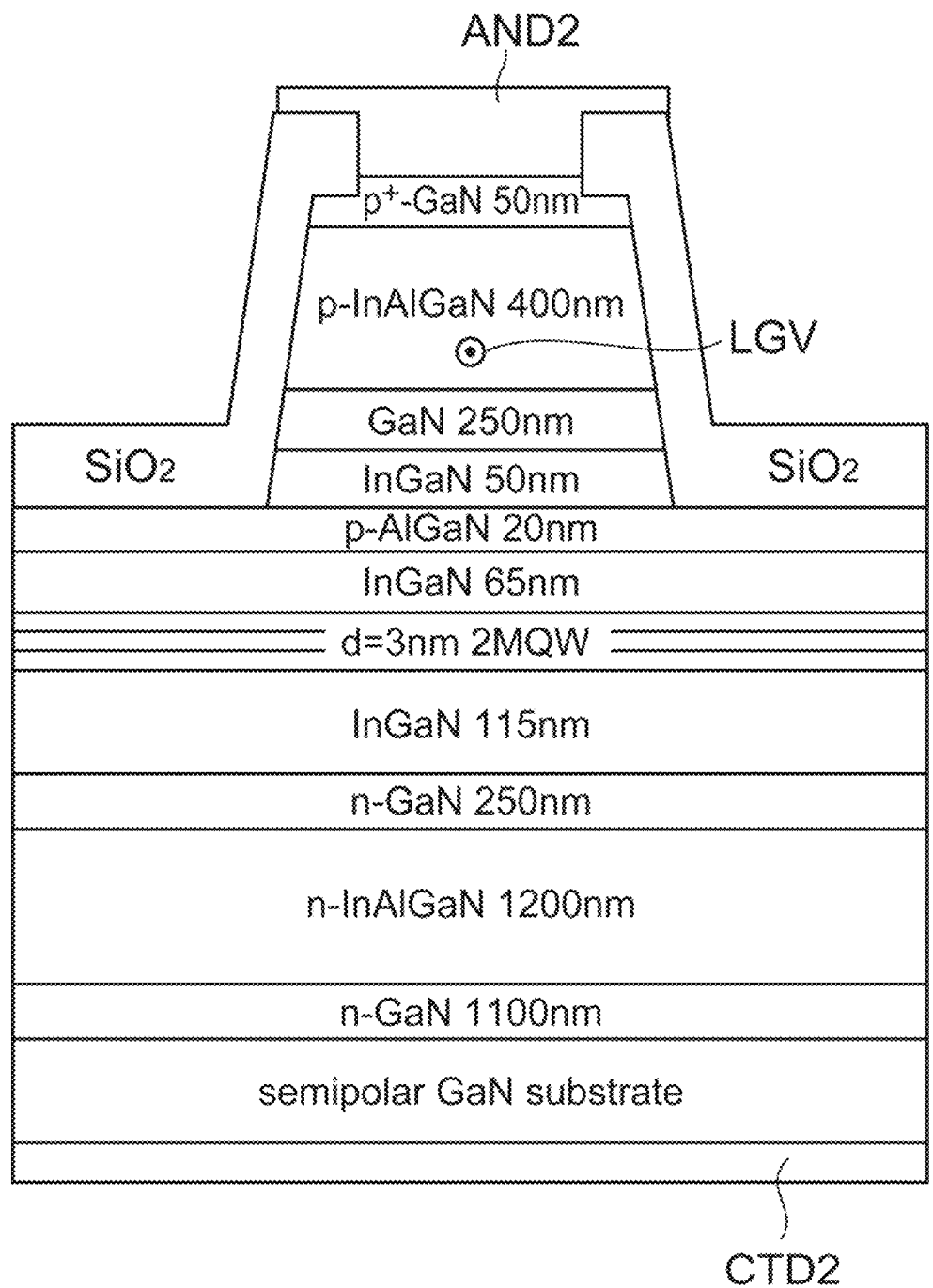
FIG. 15 is a drawing schematically showing a structure of an index guiding type laser with the ridge structure.

It is also possible to fabricate an index guiding type laser with the ridge structure shown in FIG. 15, by the following method. For producing the ridge structure in the width of 2 µm, a mask made of positive resist with a pattern in the width of 2 µm is formed by photolithography. The laser waveguide is directed in a direction parallel to the direction of the projected component as a projection of the c-axis vector onto the primary surface. The ridge structure is produced by dry etching using $Cl_2$. The etching depth is, for example, 0.7 µm, and etching of the semiconductor region of the epitaxial substrate is carried out until the AlGaN block layer is exposed. After the etching, the resist mask is removed. A stripe mask in the width of about 2 μm is left on the ridge structure by photolithography. The direction of the stripe mask is aligned with the direction of the ridge structure. Afterthat, SiO₂ is deposited on the side faces of the ridge by vacuum vapor deposition. After the vapor deposition of the insulating film, SiO₂ on the ridge is removed by the lift-off method, thereby forming the insulating film with a striped aperture. Then an anode electrode AND2 and a cathode electrode CTD2 are formed to obtain a substrate product.

The cavity mirrors for these laser stripes are made with a laser scriber using the YAG laser of the wavelength of 355 nm. The lasing chip yield can be higher in the case where the scribed grooves are formed with the laser scriber, followed by break, than in the case using the diamond scribing. The scribed grooves are formed under the following formation conditions.

Laser beam output 100 mW.
Scan speed 5 mm/s.

The scribed grooves formed under the above conditions have, for example, the length of 100 μm, the width of 10 μm, and the depth of 40 μm. The scribed grooves are periodically formed by direct irradiation with the laser beam through apertures of the electrode on the surface of the substrate at intervals of 300 μm corresponding to the semiconductor chip width. The cavity length is 600 μm.

The cavity mirrors are made by fracture using a blade. A laser bar is produced by breaking the substrate by press against an end of the backside surface of the substrate. The fractured faces for the laser cavity are formed on the semipolar surface by the method of making mirrors in end faces perpendicular to the laser waveguide provided in parallel with the direction in which the c-axis is projected onto the primary surface. The fractured faces are different from cleaved facets such as m-planes, a-planes, or c-planes used as end faces for the optical cavity in lasers on the conventional c-plane primary surface and m-plane primary surface.

In the same manner as in the previously described method, the end faces of the laser bar are coated with a dielectric multilayer film by vacuum vapor deposition. The dielectric multilayer film is composed of an alternate stack of SiO₂ and TiO₂. The thickness of each layer is adjusted in the range of 50 to 100 nm so that the center wavelength of reflectance falls within the wavelength range of 500 to 530 nm. The reflecting surface on one side has ten cycles and the designed value of reflectance is about 95%; the reflecting surface on the other side has six cycles and the designed value of reflectance is about 80%.

Evaluation by energization is carried out at room temperature. A power supply used works as a pulsed power supply with the pulse width of 500 ns and the duty ratio of 0.1%, and energization is conducted with needles on the surface electrodes. In measurement of optical output, the emission from the end face of the laser bar is detected with a photodiode to investigate the current-optical output characteristic (I-L characteristic). In measurement of emission wavelength, the emission from the end face of the laser bar is made to pass through an optical fiber, and a spectrum thereof is measured with a spectrum analyzer as a detector. The emission wavelength is in the range of 500-530 nm.

An emission image is observed with a fluorescence microscope having a mercury lamp as an excitation light source. A streaky emission image parallel to the a-axis can be obtained by observation using an objective lens of 20× or more. The parallelism between the c-axis and the laser waveguide is estimated by checking perpendicularity between the streaky emission line along the a-axis direction and the shape of the structure such as the electrode or the ridge structure. Furthermore, the angle difference between the waveguide and the end face formed by fracture is estimated by observation of the device surface with an optical microscope.

Figure 16:
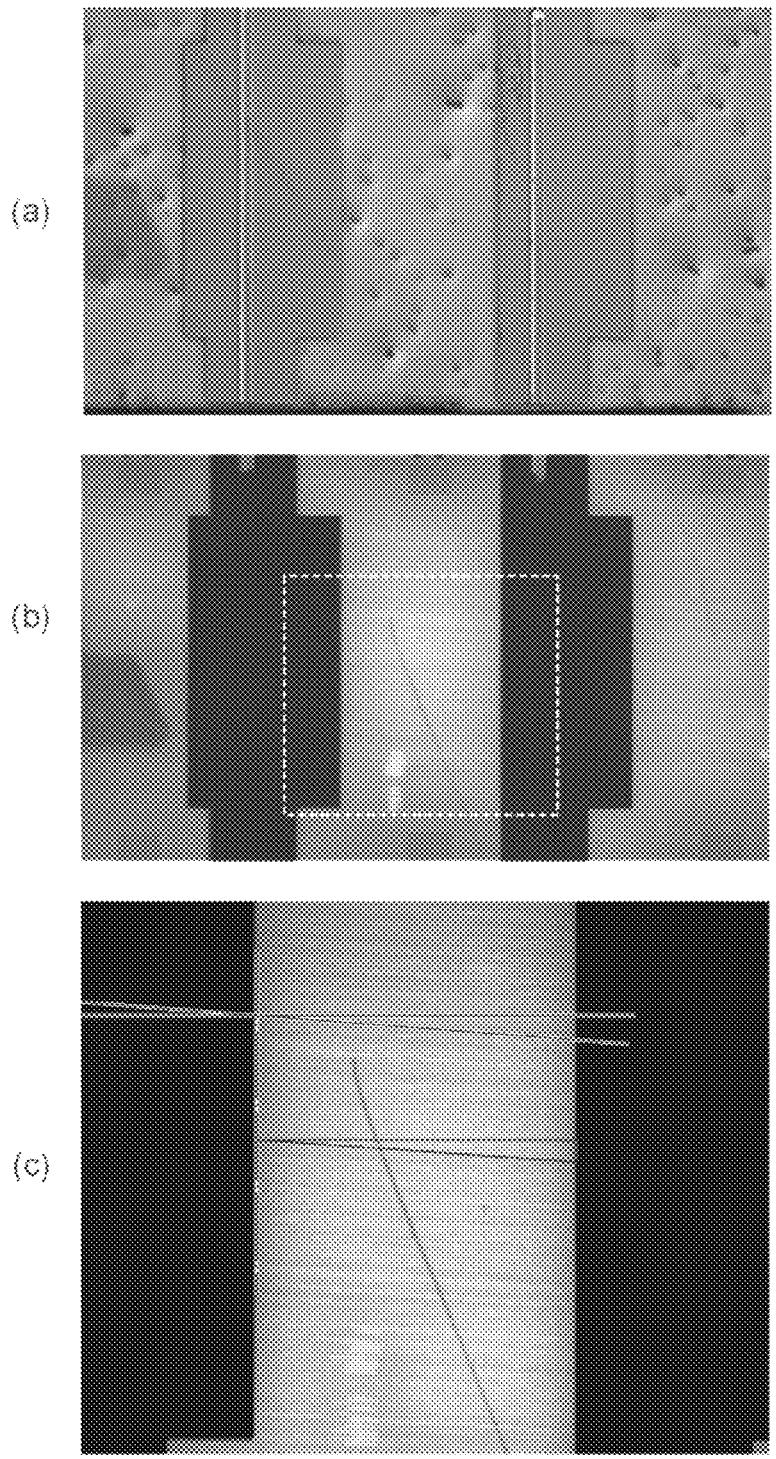
FIG. 16 is a drawing showing a Nomalsky differential interference microscope image showing an area near an anode electrode on an epi-side surface of a substrate product, an emission image obtained by excitation with a mercury lamp, and a difference between a streaky emission layer and a direction in which a laser waveguide extends.
Figure 17:
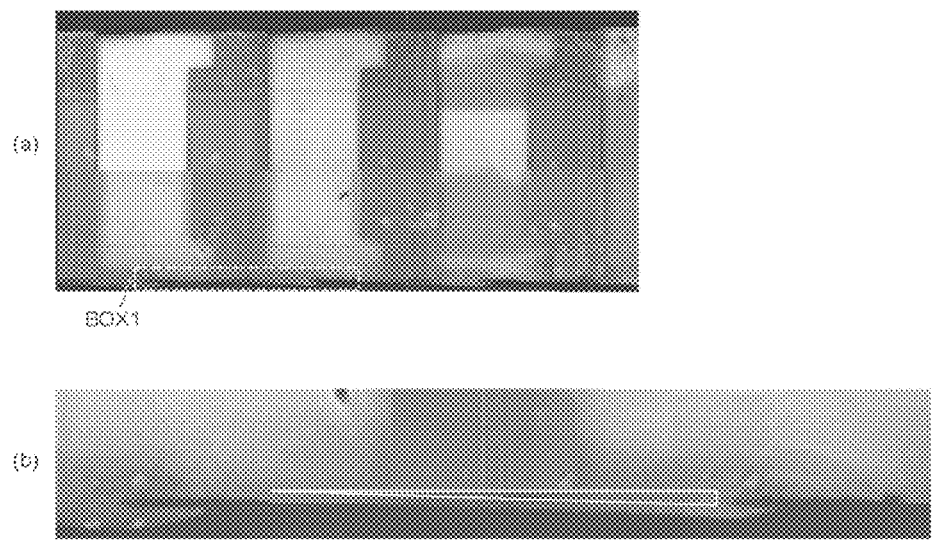
FIG. 17 is a top plan view showing a semiconductor laser given an intentionally large angle difference.

A more specific example will be described with reference to FIG. 16. FIG. 16(a) is a drawing showing a Nomalsky differential interference microscope image of an area near the anode electrode on the epitaxial surface of the substrate product. FIG. 16(b) is a drawing showing a fluorescence image (emission image obtained by excitation with a mercury lamp) showing an area indicated by a dashed line in FIG. 16(a). Streaky emission lines extend in the a-axis direction in the fluorescence image. FIG. 16(c) is a drawing showing a deviation between a streaky emission line and the extending direction of the laser waveguide in the area shown in FIG. 16(a). It is found that when the patterning is carried out without use of the technique of laser marks, the angle difference in an angle between the direction of the streaky emission line and the direction of the waveguide is about 4.0 degrees around the center of 90 degrees. Furthermore, in this semiconductor laser, the angle difference between the direction of the laser waveguide and the direction of the projected component of the c-axis is 1.77 degrees at the fractured face. FIG. 17 is a top plan view of a semiconductor laser with a large angle difference intentionally formed. With reference to FIG. 17(a), an optical microscope image of a top surface of an area including three chips of a laser bar is shown. With reference to FIG. 17(b), an enlarged view of a top surface of the laser bar near an end face thereof in a section BOX1 in FIG. 17(a) is shown. When the angle difference is large, inclination increases with respect to the laser waveguide at the upper end of the end face formed by fracture.

Figure 18:
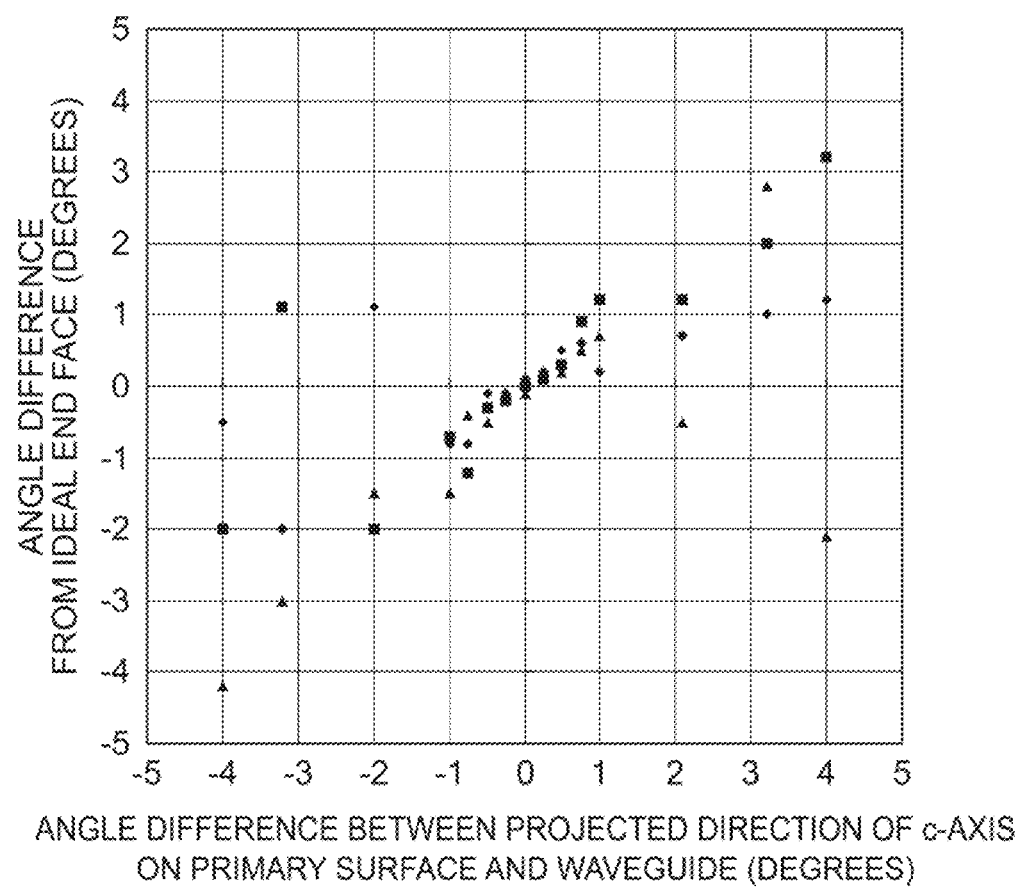
FIG. 18 is a drawing showing a relation of angle difference between the direction of the laser waveguide and the direction of the c-axis projected component versus angle difference between an ideal end face perpendicular to the waveguide and an actual end face.

FIG. 18 is a drawing showing a relation of the angle difference between the direction of the laser waveguide and the direction of the c-axis projected component, versus the angle difference between an actual end face and an ideal end face normal to the waveguide. The horizontal axis represents the angle difference between the direction of the laser waveguide and the direction of the c-axis projected component (which will be referred to as "angle difference 1"). The vertical axis represents the angle difference between the ideal end face and the actual end face (which will be referred to as "angle difference 2"). With reference to the plot of FIG. 18, the angle difference 2 can be reduced by decreasing the angle difference 1. Specifically, when the angle difference 1 has the accuracy in the range of not less than −1 degree and not more than +1 degree, the angle difference 2 has no significant variation. When the angle difference 1 exceeds the angle of 1 degree as absolute value, the angle difference 2 has significant variation.

Figure 19:
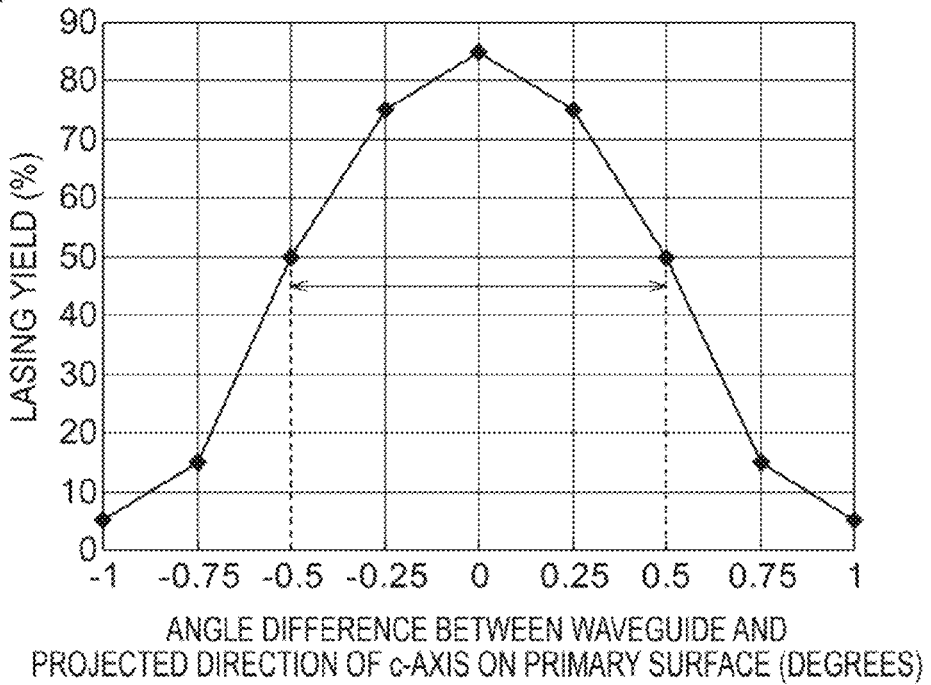
FIG. 19 is a drawing showing a relation of angle difference between the direction of the laser waveguide and the direction of the c-axis projected component (direction of the projected c-axis onto the primary surface of the substrate) versus lasing yield, and a relation of angle difference between the direction of the laser waveguide and the direction of the c-axis projected component versus variation of threshold current density.
Figure 19:
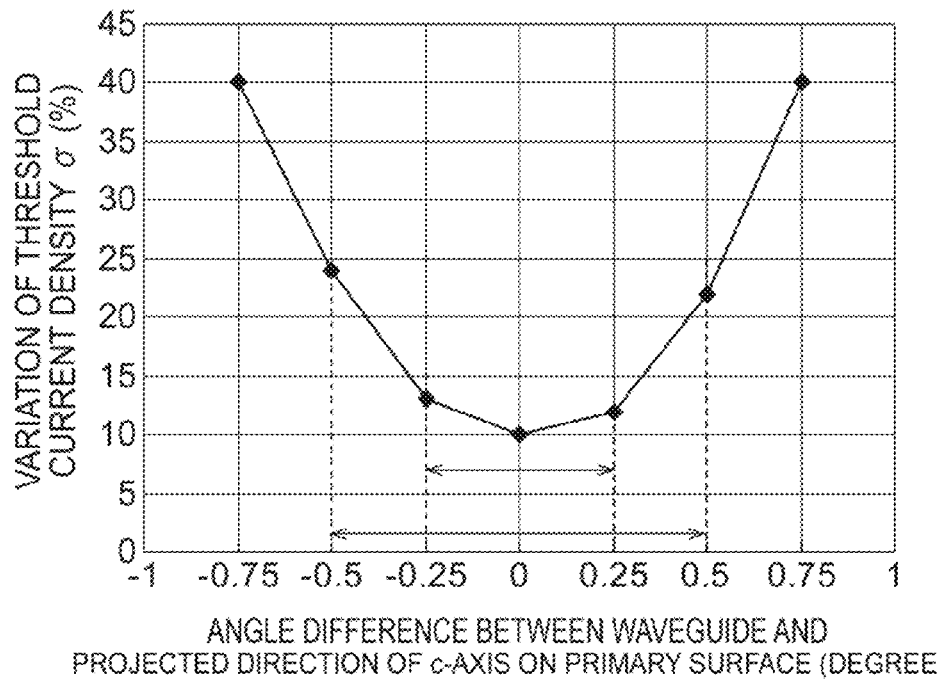

An investigation is conducted to investigate a relation of the angle difference between the direction of the laser waveguide and the c-axis projected component (projected direction of the c-axis on the primary surface of the substrate) versus lasing yield. As a result of the investigation, as shown in FIG. 19(a), the lasing yield is improved when the absolute value of the angle difference is made small. When the angle difference is in the range of not less than −0.5 degrees and not more than +0.5 degrees, the lasing yield can be not less than 50%. When the angle difference is in the range of not less than −0.25 degrees and not more than +0.25 degrees, the lasing yield can be not less than 75%. When the angle difference is in the range of not less than −0.75 degrees and not more than +0.75 degrees, the lasing yield can be not less than 15%.

An investigation is conducted to investigate a relation of the angle difference between the laser waveguide and the c-axis projected component versus variation of threshold current density. As a result of the investigation, as shown in FIG. 19(b), the variation of threshold current density (standard deviation σ) is reduced when the absolute value of the angle difference is made small. When the angle difference is in the range of not less than −0.3 degrees and not more than +0.3 degrees, the variation can be not more than 15%. Since the variation in the semiconductor laser with the angle difference of 0 degrees is about 10%, when the angle difference is in the range of not less than −0.3 degrees and not more than +0.3 degrees, the variation is controlled to about one and half times the threshold current density of the semiconductor laser with the angle difference of 0 degrees. When the angle difference is in the range of not less than −0.25 degrees and not more than +0.25 degrees, the variation can be not more than 13%. When the absolute value of the angle difference is over 0.3 degrees, change in the variation of threshold current density becomes larger. When the angle difference is in the range of not less than −0.75 degrees and not more than +0.75 degrees, the variation can be not more than 40%.

Figure 20:
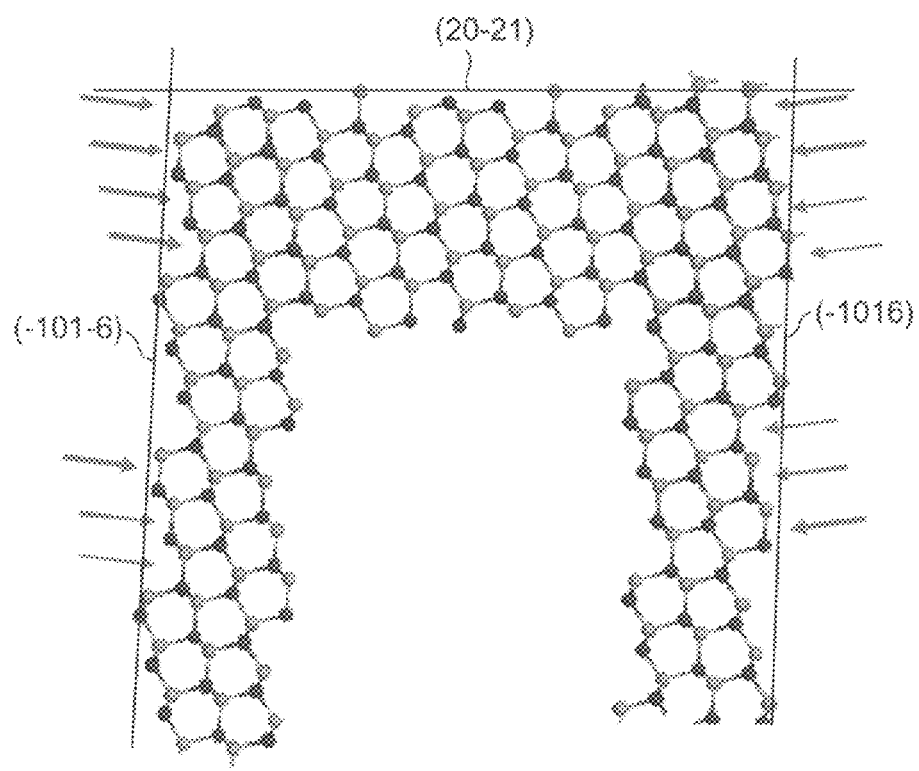
FIG. 20 is a drawing showing atomic arrangements in (20-21) plane, (-101-6) plane, and (-1016) plane.
Figure 21:
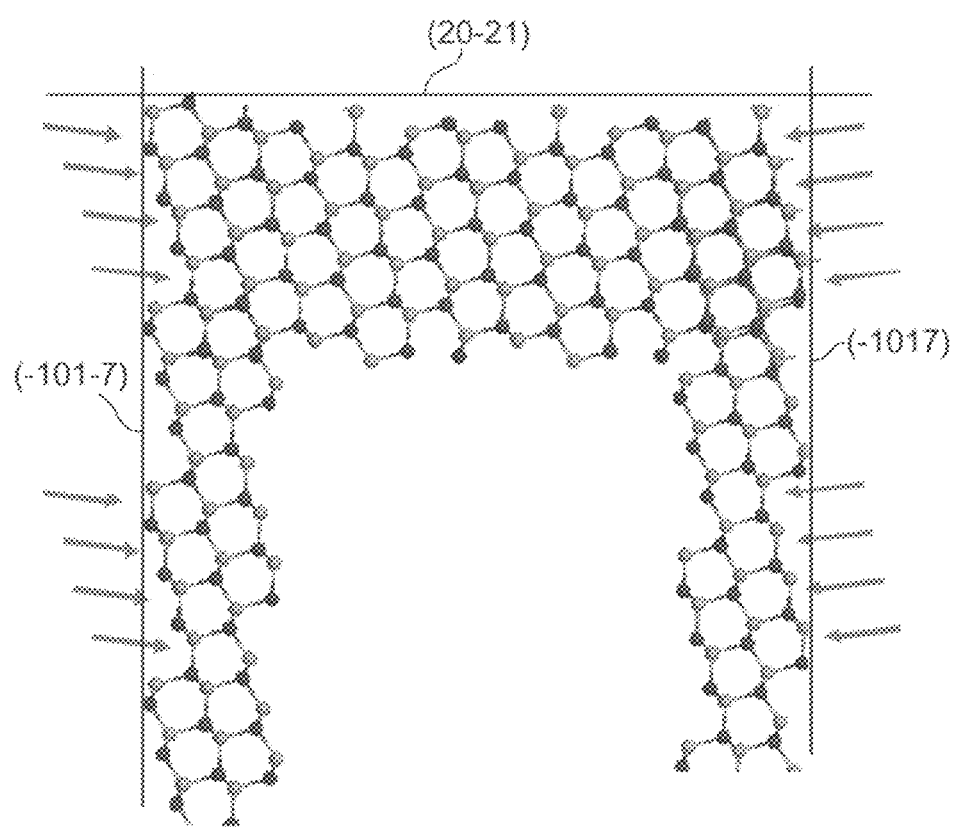
FIG. 21 is a drawing showing atomic arrangements in (20-21) plane, (-101-7) plane, and (-1017) plane.
Figure 22:
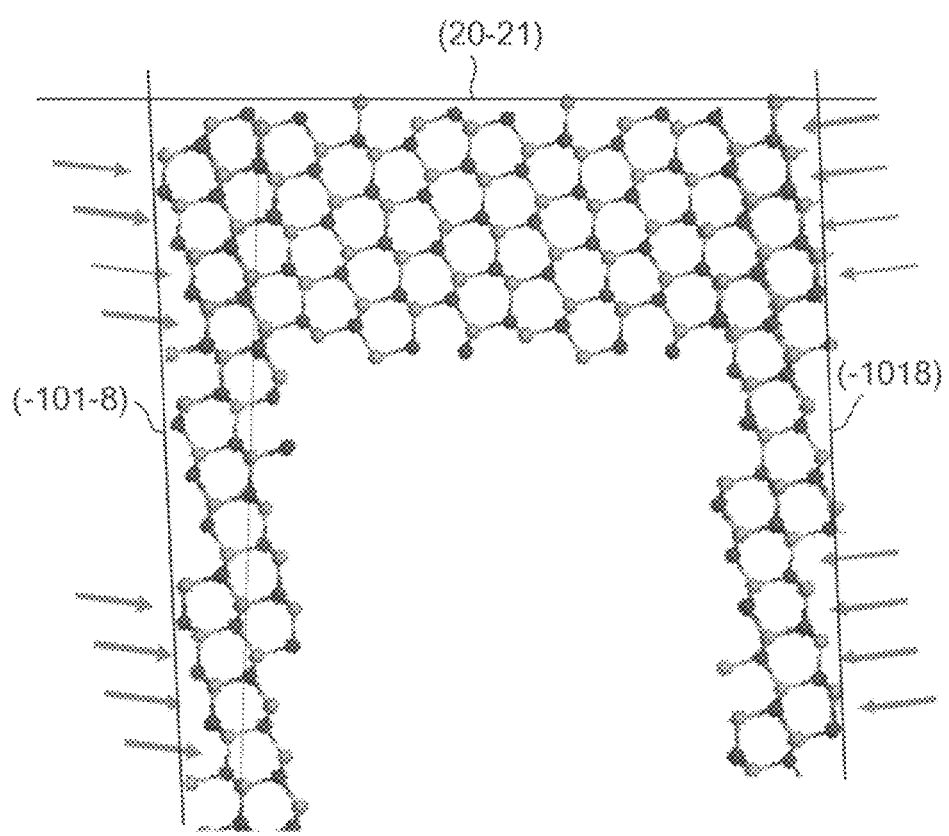
FIG. 22 is a drawing showing atomic arrangements in (20-21) plane, (-101-8) plane, and (-1018) plane.

FIG. 20 is a drawing showing arrangements of atoms in the (20-21) plane, (−101-6) plane, and (−1016) plane. FIG. 21 is a drawing showing arrangements of atoms in the (20-21) plane, (−101-7) plane, and (−1017) plane. FIG. 22 is a drawing showing arrangements of atoms in the (20-21) plane, (−101-8) plane, and (−1018) plane. As shown in FIGS. 20 to 22, local atom arrangements indicated by arrows show configurations of neutral atoms in terms of charge, and electrically neutral atom arrangements appear periodically. The reason why faces relatively normal to the grown surface are obtained can be as follows: generation of fractured faces is considered to be relatively stable because of the periodic appearance of the neutral atomic configurations in terms of charge.

According to various experiments including the above-described Examples 1 to 4, the angle ALPHA can be in the range of not less than 45 degrees and not more than 80 degrees or in the range of not less than 100 degrees and not more than 135 degrees. In order to improve the lasing chip yield, the angle ALPHA can be in the range of not less than 63 degrees and not more than 80 degrees or in the range of not less than 100 degrees and not more than 117 degrees. The typical semipolar primary surface can be any one of the {20-21} plane, {10-11} plane, {20-2-1} plane, and {10-1-1} plane. Furthermore, the primary surface can be a slight slant surface from these semipolar planes. For example, the semipolar primary surface can be a slight slant surface off in the range of not less than −4 degrees and not more than +4 degrees toward the m-plane from any one of the {20-21} plane, {10-11} plane, {20-2-1} plane, and {101-1} plane.

EXAMPLE 5

In the semiconductor laser, as described previously, the characteristic of the semiconductor laser can be made excellent and stabilized by achieving accurate perpendicularity between the waveguide and the cavity end faces. Therefore, since breakableness for the end face is largely dependent upon the crystal orientation, the accuracy of mask alignment can be enhanced when a mark accurately indicative of the crystal orientation can be found out and when the mask alignment can be achieved on the basis of the mark in parallel with or perpendicularly to the mark. A semiconductor wafer can be provided with a cut indicative of the crystal orientation, e.g., called an orientation flat (hereinafter referred to as "Ori-Fla"), as shown in FIG. 23(a).

Figure 23:
FIG. 23 is a drawing showing a structure of a substrate having an orientation flat.
Figure 23:
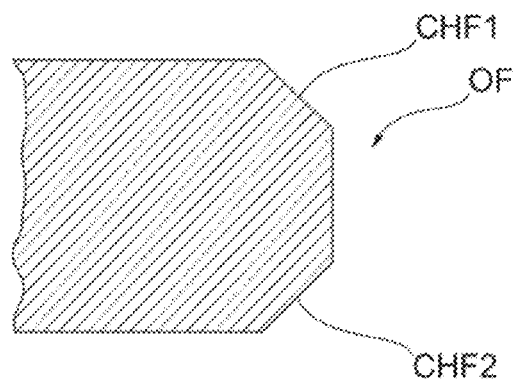
Figure 23:
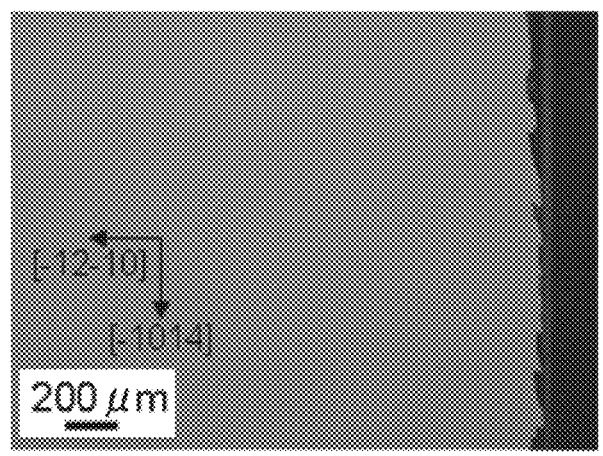

In order to avoid unexpected breakage of the wafer, the Ori-Fla is provided with chamfers CHF1, CHF2, as shown in FIG. 23(b). With Ori-Fla having the chamfers, it is not easy to improve the accuracy of focusing in patterning using the mask aligner. Since the chamfers of Ori-Fla are provided with a slope inclined relative to the primary surface of the wafer, the distance between the mask aligner and the Ori-Fla varies on the slope in the direction normal to the primary surface of the wafer. Because of this variation, the alignment using the mask aligner allows focusing at any position on the slope of the chamfer of Ori-Fla. For this reason, the accuracy of alignment depends upon which position is in focus in the range of the chamfer width of Ori-Fla and as a result, there is a limit to improvement in accuracy of alignment. On the other hand, in the case of a semipolar substrate without chamfers, chipping (crack) occurs during polishing of the substrate, and the edge of Ori-Fla can become rough without showing a straight line, as shown in FIG. 23(c). Because of this roughness, there is a limit to improvement in accuracy of alignment as a result.

Figure 24:
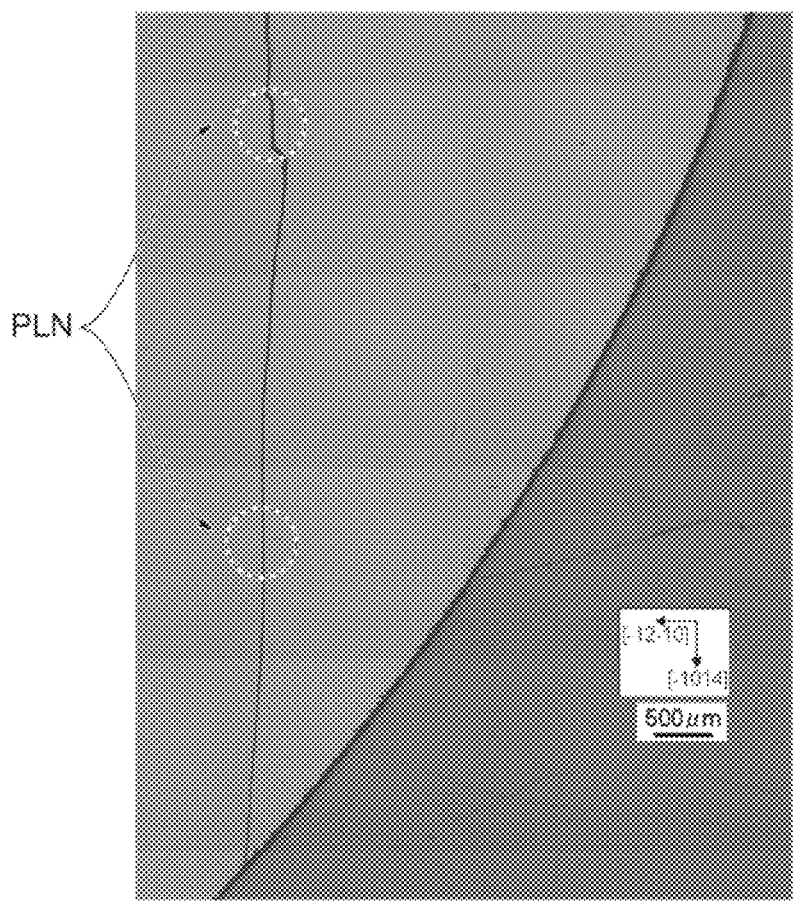
FIG. 24 is a plane view showing a wafer subjected to an attempt of a-plane cleavage.

According to Inventors' knowledge, in the case of the GaN wafer having the c-plane primary surface, in order to enhance the alignment accuracy, the epitaxial substrate is cleaved to form an edge having an m-plane, before a process in the first step after the epitaxial growth. This m-plane edge can be used as a reference for the mask alignment. When this m-plane edge forming technique is applied to the semipolar epitaxial substrate having semipolar nature of the {20-21} plane, an a-plane edge is formed instead of the m-plane. The following description will be given using an example of an epitaxial substrate having a {20-21} plane as a semipolar plane. The inventors attempt to form an a-plane perpendicular to the primary surface of the epitaxial substrate by cleavage, but sometimes fail to obtain a linear fractured edge, as shown in FIG. 24. FIG. 24 is a plan view showing a wafer obtained by the attempt of a-plane cleavage. For example, the fractured edge includes linearly extending portions PLN but the fissure meanders as a whole. A conceivable reason for it is that the GaN-based semiconductor is less likely to linearly break along the a-plane in formation of the a-plane edge than that along the m-plane.

It is clarified by careful observation by the inventors that a defect peculiar to semipolar nature is formed in the epitaxial semiconductor region grown on the semipolar substrate.

Figure 25:
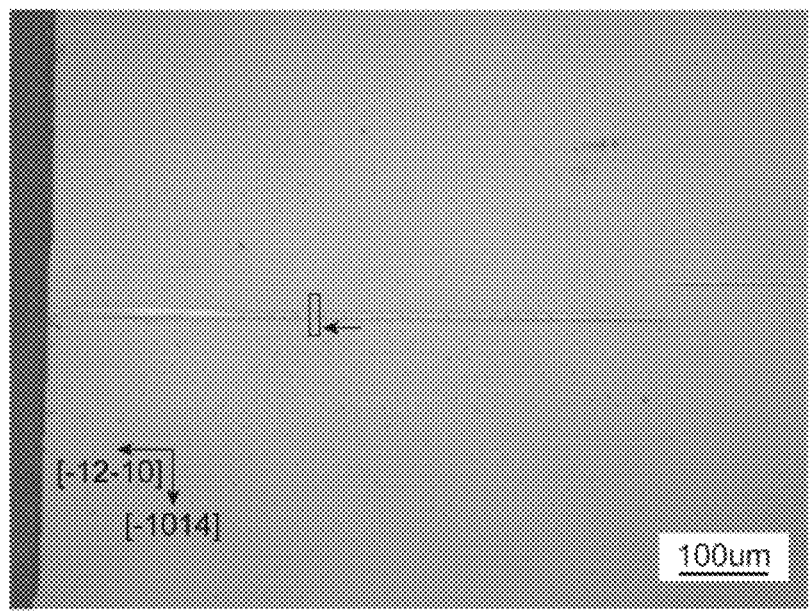
FIG. 25 is a drawing showing a Nomalsky differential interference microscope image of an outermost epi-side surface.
Figure 26:
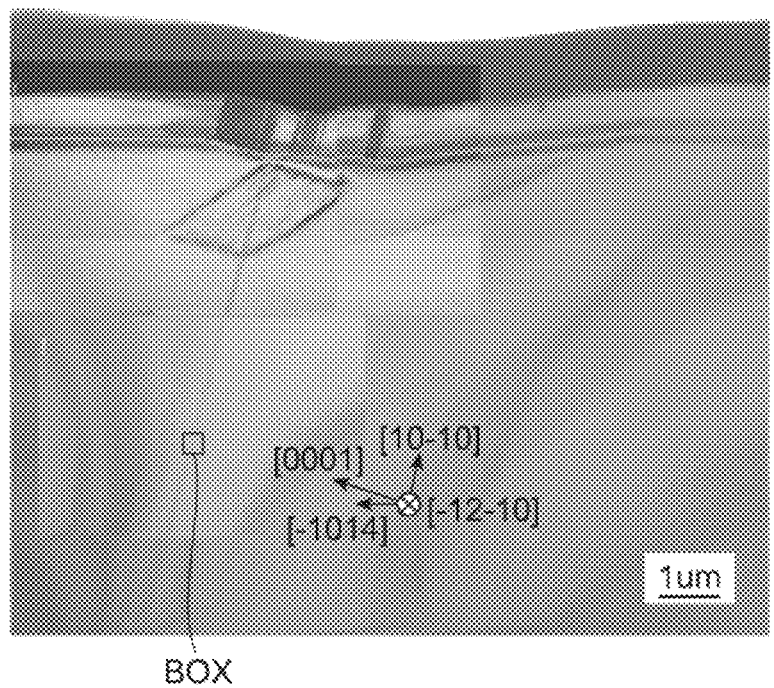
FIG. 26 is a drawing showing a transmission electron microscope image in a cross section of a region in a box indicated by an arrow in FIG. 25.
Figure 27:
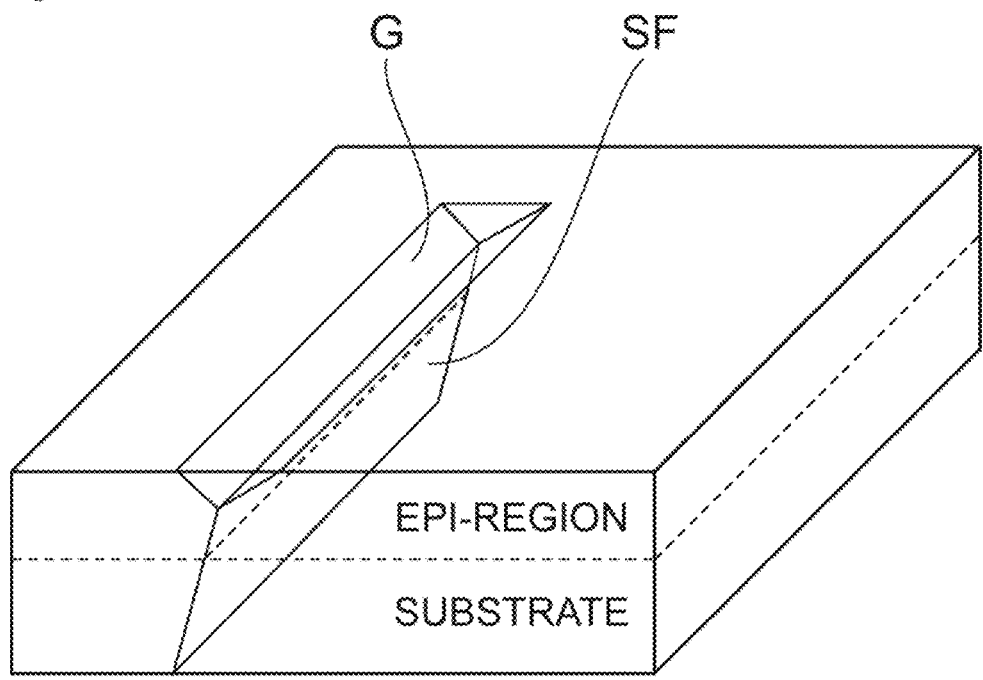
FIG. 27 is a drawing schematically showing a stacking fault SF in a GaN-based semiconductor and a defect G of an epi-side surface.

A surface morphology is an example of the defect. For example, a laser structure is epitaxially grown on a {20-21}-plane substrate and thereafter the outermost epitaxial surface thereof is observed with a Nomalsky differential interference microscope. FIG. 25 is a drawing showing a Nomalsky differential interference microscope image of the outermost epitaxial surface. As shown in FIG. 25, a linear morphology approximately parallel to the a-axis direction is observed in the surface. For investigating this morphology, the epitaxial substrate is observed with a transmission electron microscope (TEM). FIG. 26 is a drawing showing a transmission electron microscope image in a cross section of a region in a box indicated by an arrow in FIG. 25. With reference to FIG. 26, a depression is observed in the epitaxial surface and this depression is observed as the linear morphology. FIG. 27 is a drawing schematically showing a stacking fault SF in the GaN-based semiconductor and a defect (e.g., a groove) G in the epitaxial surface. As shown in the schematic diagram of FIG. 27, a defect is observed at the substrate position of the depression portion, and propagates from the substrate in the lower part of the photograph.

Figure 28:
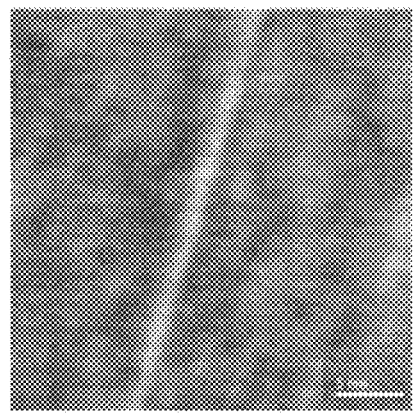
FIG. 28 is a drawing showing high-resolution transmission electron microscope (HR-TEM) images of region BOX shown in FIG. 26.
Figure 28:
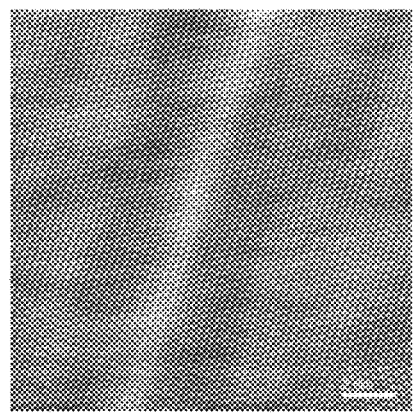
Figure 28:
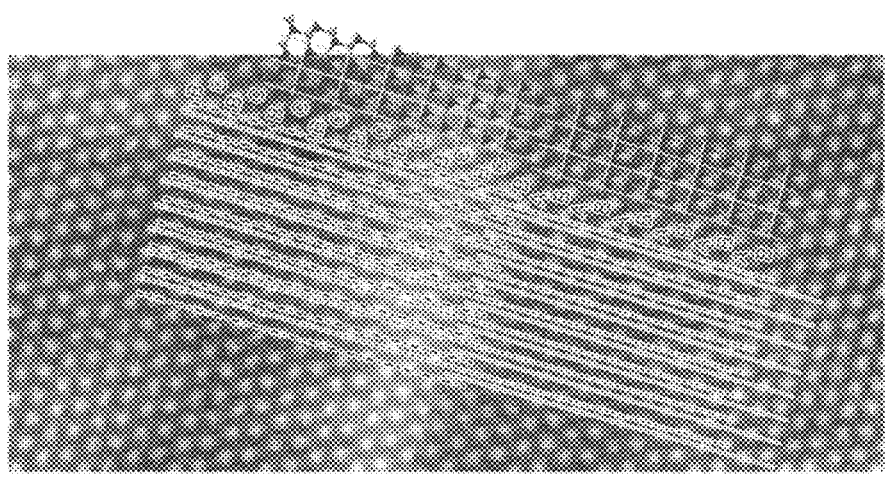

For more detailed investigation of the defect, a region BOX shown in FIG. 26 is observed with a high-resolution transmission electron microscope (HR-TEM). FIG. 28 shows the result of the observation. Images at different magnifications are shown in parts (a), (b) and (c) in FIG. 28. The stack structure near the defect is analyzed in detail, and it is shown by the result of the analysis that the stack structure of crystal faces varied from ABABAB . . . to BCBCBC . . . at the boundary of the defect. Therefore, this defect shows a stacking fault. Since this stacking fault exists in the c-plane, it extends in the a-axis direction (accurately in the [−12-10] direction as shown in FIG. 28). The depression is formed in the epitaxial surface at an intersection between the stacking fault and the epitaxial surface. For this reason, the epitaxial substrate according to the present embodiment contains the structure including the stacking fault formed in the c-plane and the linear depression associated with this stacking fault.

In the epitaxial substrate, therefore, the directions of the depression and the stacking fault extremely accurately indicate the a-axis direction. By using the depression in the epitaxial surface as a mark, it becomes feasible to achieve the mask alignment of the waveguide such that the waveguide is perpendicular to this mark. Therefore, it is feasible to achieve alignment of the mask accurately perpendicularly to the a-axis direction and accurately in parallel with the projected direction of the c-axis onto the primary surface.

The foregoing stacking fault is incidentally generated during crystal growth on the substrate, and is desirably included in the density of not less than 0.2 (cm$^{-1}$) in the wafer surface. If the stacking fault density is smaller than this value, the stacking fault is less likely to be made in the substrate used for epitaxial growth in fabrication of laser. The stacking fault density is preferably not more than 10 (cm$^{-1}$) in the wafer surface, and at the densities over this value, the yield of laser device will be affected. The length of the stacking fault on the epitaxial surface (the length of the depression) is preferably not less than 230 µm. When the length of the mark is not less than 230 µm, accurate mask alignment can be achieved.

EXAMPLE 6

Figure 29:
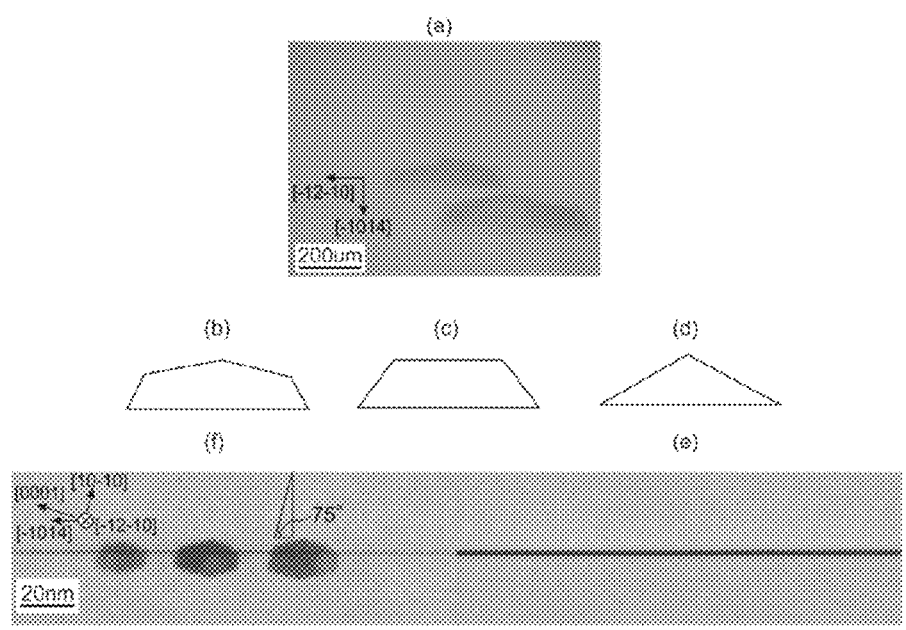
FIG. 29 is a drawing showing a fluorescence image of an epitaxial substrate based on excitation with a mercury lamp.

An epitaxial laminate structure for a laser structure is grown on a {20-21}-plane GaN substrate. The epitaxial laminate structure included an n-type semiconductor region, an active layer and a p-type semiconductor region and the active layer has a single quantum well structure of an InGaN well layer. After this growth, a fluorescence image of the top surface of the epitaxial substrate is observed by excitation with a mercury lamp (wavelength 365 nm). FIG. 29(*a*) is a drawing showing the fluorescence image, provided by excitation with the mercury lamp, of the top surface of the epitaxial substrate. As shown in FIG. 29(*a*), a dark region (region without emission by excitation with the mercury lamp) is observed in the emission image of the top surface. The dark region has, for example, a pentagonal shape. The longest side (longer side) of the pentagonal shape is approximately parallel to the a-axis direction. According to Inventors' observation, the dark region has a cross section of any one of typical cross-sectional shapes as shown in (b), (c) and (d) in FIG. 29, e.g., a pentagonal shape, a trapezoid shape such as an isosceles trapezoid, or a triangular shape such as an isosceles triangle, and these cross-sectional shapes are axisymmetric with respect to an axis perpendicular to the longest side. For example, each of the triangular shape and the pentagonal shape is axisymmetric with respect to an axis which passes a vertex and is perpendicular to the long side.

For further investigating the cause of this dark region, a cross section is observed with a scanning transmission electron microscope (STEM). As a result of this observation, it is found that the well layer is steeply formed in a good region (cross section) shown in FIG. 29(*e*), whereas deposits of a hexagonal shape are observed in the well layer in the dark regions (cross sections) shown in FIG. 29(*f*). The deposits are investigated by energy dispersion type X-ray spectroscopy (EDX), and the investigation finds that the deposit regions are In-rich regions. One side of the hexagonal shape makes an angle of 75 degrees with respect to a plane parallel to the semipolar primary surface of the GaN substrate, and is thus a (0001) plane. For this reason, the shape of this structure reflects the crystal orientation. According to Inventors' observation, the deposits extend in the a-axis direction. Cross sections of the deposits in the depth direction thereof have approximately identical cross-sectional shape. Therefore, when the mask alignment is performed so as to align the waveguide in parallel with the longer side of the dark region in observation of the surface of the epitaxial substrate, the mask alignment can be achieved accurately perpendicularly to the a-axis direction and accurately in parallel with the direction of the projected c-axis onto the primary surface.

The foregoing dark region can include a crystal defect formed in the active layer, and in the active layer of the emission wavelength of not less than 500 nm, the crystal defect is likely to be introduced to the well layer because of the growth temperature or the quantum well structure. This crystal defect is applicable as an alignment mark. The dark region is more likely to be generated when the growth temperature of the p-type semiconductor layer after growth of the light emitting layer is too high or when the growth time thereof is long.

The longer side of the dark region in the emission image in excitation with the mercury lamp preferably extends, for example, in the direction of the a-axis, and the longer side preferably has the length of not less than 230 µm. Since the defect region observed as the dark region in the emission image in excitation with the mercury lamp is a defect associated with crystal growth, crystallographic information is reflected in its shape, orientation, etc. of the structure. The dark region is characterized in that it expands by a thermal treatment at a high temperature of not less than 800 degrees Celsius.

As described above, the epitaxial substrate for the III-nitride semiconductor laser device can have the following structure. The epitaxial substrate has the substrate with the semipolar primary surface of the hexagonal III-nitride semiconductor, and the semiconductor laminate provided on the semipolar primary surface of the substrate. This semiconductor laminate includes the semiconductor region for the laser structure, and this semiconductor region includes the first cladding layer of the first conductivity type GaN-based semiconductor, the second cladding layer of the second conductivity type GaN-based semiconductor, and the active layer. The active layer includes the GaN-based semiconductor layer. The c-axis of the hexagonal III-nitride semiconductor of the substrate is inclined at the angle ALPHA with respect to the normal axis toward the m-axis of the hexagonal III-nitride semiconductor. The semiconductor laminate includes the aforementioned structure that extends in the direction of the reference axis indicative of the direction of the a-axis of the hexagonal III-nitride semiconductor.

This epitaxial substrate is suitable for the shape of the III-nitride semiconductor laser device including the laser stripe that extends in the direction of the m-n plane defined by the m-axis of the hexagonal III-nitride semiconductor and the normal axis. The III-nitride semiconductor laser device is formed on the semipolar substrate. However, since the semiconductor laminate includes the belt-like structure having the edge that extends in the direction of the reference axis indicative of the direction of the a-axis of the hexagonal III-nitride semiconductor, this structure can provide the directing of the laser stripe or the directing of the laser cavity for the III-nitride semiconductor laser device which is fabricated using this epitaxial substrate. Preferably, the angle ALPHA between the normal axis and the c-axis of the hexagonal III-nitride semiconductor is in the range of not less than 45 degrees and not more than 80 degrees or in the range of not less than 100 degrees and not more than 135 degrees. The active layer is provided between the first cladding layer and the second cladding layer, and the first cladding layer, the second cladding layer, and the active layer are arranged along the normal axis to the semipolar primary surface.

The structure can have the surface morphology, extending in the direction of the a-axis, formed on the top surface of the semiconductor laminate. In this case, it becomes feasible to confirm the structure by observation of the appearance of the epitaxial substrate. When the structure includes the depression in the top surface of the semiconductor laminate, the position of the depression can be specified by reflected light or transmitted light of monitoring light ranging from ultra-violet light through visible light to infrared light. The foregoing structure in the epitaxial substrate (e.g., the longer side of the dark region or the groove in the epitaxial surface) preferably makes the angle difference in the range of not less than −0.5 degrees and not more than +0.5 degrees with respect to the direction of the a-axis. Furthermore, the structure more preferably makes the angle difference in the range of not less than −0.3 degrees and not more than +0.3 degrees with respect to the direction of the a-axis.

The III-nitride semiconductor laser device can be fabricated through the following steps using the epitaxial substrate.

The mask alignment can be performed using the linear morphology such as the groove provided in the epitaxial surface. When the semiconductor product is placed on the mask aligner, the linear morphology can be detected with a sensor device of the mask aligner or by visual observation. In the mask alignment to determine the direction of the waveguide, the position and orientation of the semiconductor product on the mask aligner are determined so that the direction of the waveguide is made perpendicular to the linear morphology.

The mask alignment can be performed using the dark region in the excited image with the mercury lamp. A laser scriber device equipped with a mercury lamp is prepared. The semiconductor product is loaded on this laser scriber device. With the laser scriber device, the product is excited with the mercury lamp to obtain an emission image. Using the dark region in the emission image, the direction alignment of the semiconductor product is carried out on the laser scriber device. A mark is formed on the semiconductor product with the laser scriber device. The mask alignment is carried out with reference to this mark. This procedure allows accurate alignment between the waveguide and the crystal orientation.

As explained above, the present embodiments provide a III-nitride semiconductor laser device with a laser cavity, enabling a low threshold current and a structure enabling improvement in lasing yield, on a semipolar plane of a support base inclined from the c-axis toward the m-axis of a hexagonal III-nitride. Further, the present embodiments provide a method of fabricating the III-nitride semiconductor laser device. Furthermore, the present embodiments provide an epitaxial substrate for the III-nitride semiconductor laser device.

Having described and illustrated the principle of the invention in a preferred embodiment thereof, it is appreciated by those skilled in the art that the invention can be modified in arrangement and detail without departing from such principles. We therefore claim all modifications and variations coming within the spirit and scope of the following claims.

What is claimed is:

1. A method of fabricating a III-nitride semiconductor laser device, the method comprising steps of:
    preparing a substrate, the substrate comprising a hexagonal III-nitride semiconductor and having a semipolar primary surface;
    forming a substrate product having a laser structure, an anode electrode and a cathode electrode, the laser structure including a semiconductor region and the substrate, and the semiconductor region being formed on the semipolar primary surface;
    scribing a first surface of the substrate product in part in a direction of an a-axis of the hexagonal III-nitride semiconductor; and
    carrying out breakup of the substrate product by press against a second surface of the substrate product, to form another substrate product and a laser bar,
    the first surface being a surface opposite to the second surface,
    the semiconductor region being located between the first surface and the substrate,
    the laser bar having first and second end faces, the first and second end faces extending from the first surface to the second surface and being made by the breakup,
    the first and second end faces constituting a laser cavity of the III-nitride semiconductor laser device,
    the anode electrode and the cathode electrode being formed on the laser structure,
    the semiconductor region including a first cladding layer of a first conductivity type GaN-based semiconductor, a second cladding layer of a second conductivity type GaN-based semiconductor, and an active layer provided between the first cladding layer and the second cladding layer,
    the first cladding layer, the second cladding layer, and the active layer being arranged along a normal axis to the semipolar primary surface,
    the active layer comprising a GaN-based semiconductor layer,
    a c-axis of the hexagonal III-nitride semiconductor of the substrate being inclined at an angle ALPHA with respect to the normal axis toward the m-axis of the hexagonal III-nitride semiconductor;
    the first and second end faces intersecting with an m-n plane, the m-n plane being defined by an m-axis of the hexagonal III-nitride semiconductor and the normal axis,
    the angle ALPHA being in one of a range of not less than 45 degrees and not more than 80 degrees and a range of not less than 100 degrees and not more than 135 degrees,
    the laser structure comprising a laser waveguide, the laser waveguide extending on the semipolar primary surface of the substrate, and the laser waveguide extending in a direction of a waveguide vector directed from one to another of the first and second fractured faces,
    a c-axis vector indicating a direction of the c-axis of the hexagonal III-nitride semiconductor and including a projected component parallel to the semipolar primary surface and a vertical component parallel to the normal axis,
    an angle difference between the waveguide vector and the projected component is in a range of not less than −0.5 degrees and not more than +0.5 degrees, the semiconductor region of the substrate product comprising a mark indicative of a direction of the a-axis of the hexagonal III-nitride semiconductor,
in the step of forming the substrate product, a direction of the laser waveguide being determined based on the mark.

2. The method according to claim 1, wherein the angle difference is in a range of not less than −0.3 degrees and not more than +0.3 degrees.

3. The method according to claim 1, wherein the angle ALPHA is in one of a range of not less than 63 degrees and not more than 80 degrees and a range of not less than 100 degrees and not more than 117 degrees.

4. The method according to claim 1, wherein
in the step of forming the substrate product, processing such as slicing or grinding of the substrate is performed so that a thickness of the substrate becomes not more than 400 μm, and
the second surface includes one of a processed surface made by the processing and a surface including an electrode formed on the processed surface.

5. The method according to claim 1, wherein
in the step of forming the substrate product, the substrate is polished so that a thickness of the substrate becomes not less than 50 μm and not more than 100 μm, and
the second surface includes one of a polished surface formed by the polishing and a surface including an electrode formed on the polished surface.

6. The method according to claim 1, wherein
the scribing is carried out using a laser scriber,
the scribing forms a scribed groove, and a length of the scribed groove is shorter than a length of a line of intersection between the first surface and an a-n plane defined by the a-axis of the hexagonal III-nitride semiconductor and the normal axis.

7. The method according to claim 1, wherein the semipolar primary surface is any one of a {20-21} plane, a {10-11} plane, a {20-2-1} plane, and a {10-1-1} plane.

8. The method according to claim 1, wherein an end face of the active layer in each of the first and second end faces makes an angle with respect to a reference plane in a range of not less than (ALPHA−5) degrees and not more than (ALPHA+5) degrees on a plane defined by the c-axis and the m-axis of the hexagonal III-nitride semiconductor, and the reference plane is perpendicular to the m-axis of the substrate of the hexagonal nitride semiconductor.

9. The method according to claim 1, wherein the substrate comprises any one of GaN, AlN, AlGaN, InGaN, and InAlGaN.

10. The method according to claim 1, wherein the substrate comprises an orientation flat indicative of an a-plane of the hexagonal III-nitride semiconductor, and the mark comprises the orientation flat.

11. The method according to claim 1, wherein the substrate comprises a cleaved facet along an a-plane of the hexagonal III-nitride semiconductor and the mark includes the cleaved facet.

12. The method according to claim 1, wherein in the step of forming the substrate product, a laser beam is applied to the substrate product to form laser marks arrayed in a direction of the a-axis of the hexagonal III-nitride semiconductor, and the mark includes an array of the laser marks.

13. The method according to claim 12, wherein the laser structure exhibits a streaky emission image extending in a direction of a predetermined axis in a fluorescence microscope image created by photoexcitation with a mercury lamp, a direction of the array of the laser marks is determined based on a direction of the predetermined axis of the streaky emission image, and
an angle difference between the waveguide vector and a direction orthogonal to the predetermined axis is in a range of not less than −0.5 degrees and not more than +0.5 degrees.

14. A method of fabricating a III-nitride semiconductor laser device, the method comprising the steps of:
preparing an epitaxial substrate,
the epitaxial substrate which includes a support base comprising a hexagonal III-nitride semiconductor and having a semipolar primary surface, and a semiconductor laminate provided on the semipolar primary surface of the support base,
the semiconductor laminate including a semiconductor region for a laser structure,
the semiconductor region including a first cladding layer of a first conductivity type GaN-based semiconductor, a second cladding layer of a second conductivity type GaN-based semiconductor, and an active layer provided between the first cladding layer and the second cladding layer,
the first cladding layer, the second cladding layer, and the active layer being arranged along a normal axis to the semipolar primary surface,
the active layer comprising a GaN-based semiconductor layer,
a c-axis of the hexagonal III-nitride semiconductor of the support base being inclined at an angle ALPHA with respect to the normal axis toward an m-axis of the hexagonal III-nitride semiconductor,
the angle ALPHA between the normal axis and the c-axis of the hexagonal III-nitride semiconductor being in one of a range of not less than 45 degrees and not more than 80 degrees and a range of not less than 100 degrees and not more than 135 degrees,
the semiconductor laminate including a structure that extends along a reference axis indicating an a-axis of the hexagonal III-nitride semiconductor;
forming a substrate product with an anode electrode and a cathode electrode, using the epitaxial substrate;
forming a scribed mark on the substrate product, a direction of the scribed mark being defined with reference to the structure; and
performing breakup of the substrate product by press on the substrate product to form another substrate product and a laser bar,
the laser bar including first and second end faces formed by the breakup;
the first and second end faces constituting a laser cavity of the III-nitride semiconductor laser device;
the substrate product comprising a laser structure, the laser structure including the substrate with the semipolar primary surface of the hexagonal III-nitride semiconductor, and the semiconductor region being formed on the semipolar primary surface;
the anode electrode and the cathode electrode being formed on the laser structure;
the first and second end faces intersecting with an m-n plane, the m-n plane being defined by an m-axis of the hexagonal III-nitride semiconductor and the normal axis.

15. The method according to claim 14, wherein
the step of forming the substrate product comprises forming an insulating film to cover the semiconductor region of the laser structure;

an aperture of a stripe shape is formed in the insulating film;
a direction of the aperture is defined with reference to the structure in formation of the insulating film;
either one of the anode electrode and the cathode electrode is in contact with the laser structure through the aperture of the insulating film.

16. The method according to claim 14, wherein
the semiconductor region of the laser structure has a ridge structure;
the ridge structure has a stripe shape;
in formation of the ridge structure, a direction of the stripe shape of the ridge structure is determined with reference to the structure.

* * * * *